(12) United States Patent
Kohama

(10) Patent No.: US 11,276,617 B2
(45) Date of Patent: Mar. 15, 2022

(54) ELECTRONIC DEVICE MOUNTING BOARD, ELECTRONIC PACKAGE, AND ELECTRONIC MODULE

(71) Applicant: KYOCERA Corporation, Kyoto (JP)

(72) Inventor: Kenichi Kohama, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/767,342

(22) PCT Filed: Nov. 28, 2018

(86) PCT No.: PCT/JP2018/043755
§ 371 (c)(1),
(2) Date: May 27, 2020

(87) PCT Pub. No.: WO2019/107400
PCT Pub. Date: Jun. 6, 2019

(65) Prior Publication Data
US 2020/0402873 A1 Dec. 24, 2020

(30) Foreign Application Priority Data

Nov. 28, 2017 (JP) .............................. JP2017-228138

(51) Int. Cl.
*H01L 23/13* (2006.01)
*H01L 23/473* (2006.01)
*H01L 23/498* (2006.01)
*H01L 23/00* (2006.01)
*H01L 27/146* (2006.01)

(52) U.S. Cl.
CPC ............ *H01L 23/13* (2013.01); *H01L 23/473* (2013.01); *H01L 23/49822* (2013.01); *H01L 24/48* (2013.01); *H01L 27/14618* (2013.01); *H01L 2224/48227* (2013.01)

(58) Field of Classification Search
CPC ....... H01L 23/13; H01L 23/15; H01L 23/473; H01L 23/49822; H01L 23/3731; H01L 23/3735; H01L 23/467; H01L 24/48; H01L 27/14618; H01L 2924/15151; H01L 23/46–4735
See application file for complete search history.

(56) References Cited

U.S. PATENT DOCUMENTS

| | | | |
|---|---|---|---|
| 6,480,514 B1 * | 11/2002 | Lorenzen | H01S 5/02423 |
| | | | 372/35 |
| 2010/0155035 A1 * | 6/2010 | Ishida | H01L 23/473 |
| | | | 165/80.4 |
| 2015/0221579 A1 * | 8/2015 | Iwata | H01L 23/473 |
| | | | 257/714 |

FOREIGN PATENT DOCUMENTS

| | | |
|---|---|---|
| JP | 02-121355 A | 5/1990 |
| JP | 2006-100410 A | 4/2006 |
| WO | 2007/086353 A1 | 8/2007 |
| WO | 2014/014054 A1 | 1/2014 |

* cited by examiner

*Primary Examiner* — Amar Movva
(74) *Attorney, Agent, or Firm* — Volpe Koenig

(57) ABSTRACT

An electronic device is mountable on a substrate. The substrate includes a first layer and a second layer located on a lower surface of the first layer. The first layer includes a plurality of first through-cavities. The second layer includes at least one second through-cavity overlapping the plurality of first through-cavities in a plan view. The plurality of first through-cavities are continuous with the at least one second through-cavity.

18 Claims, 14 Drawing Sheets

ELECTRONIC DEVICE MOUNTING BOARD, ELECTRONIC PACKAGE, AND ELECTRONIC MODULE

FIELD

The present invention relates to an electronic device mounting board on which an electronic device such as an imaging device including a charge-coupled device (CCD) or a complementary metal-oxide semiconductor (CMOS) device, a light-emitting device including a light-emitting diode (LED), a device for sensing pressure, air pressure, acceleration, or a gyro sensor, or an integrated circuit is mountable, and to an electronic package and an electronic module.

BACKGROUND

A known electronic device mounting board includes a wiring board including insulating layers. Also, a known electronic package includes such an electronic device mounting board on which an electronic device is mounted. The electronic package may include a flow channel for dissipating heat (refer to Japanese Unexamined Patent Application Publication No. 2006-100410).

An electronic device may partly generate more heat in, for example, a sensing unit and a calculation unit, than in other parts during operation. The structure described in Patent Literature 1 thus includes a flow channel for improving heat dissipation. A recent smaller electronic device mounting board has a smaller area and thus has a difficulty in providing a sufficient flow channel.

BRIEF SUMMARY

An electronic device mounting board according to an aspect of the present invention includes a substrate on which an electronic device is mountable. The substrate includes a first layer and a second layer located on a lower surface of the first layer. The first layer includes a plurality of first through-cavities. The second layer includes at least one second through-cavity overlapping the plurality of first through-cavities in a plan view. The plurality of first through-cavities are continuous with the at least one second through-cavity.

An electronic package according to another aspect of the present invention includes the electronic device mounting board, and an electronic device mounted on the electronic device mounting board.

An electronic module according to still another aspect of the present invention includes a housing located on an upper surface of the electronic package or surrounding the electronic package.

DETAILED DESCRIPTION

Figure 1A:
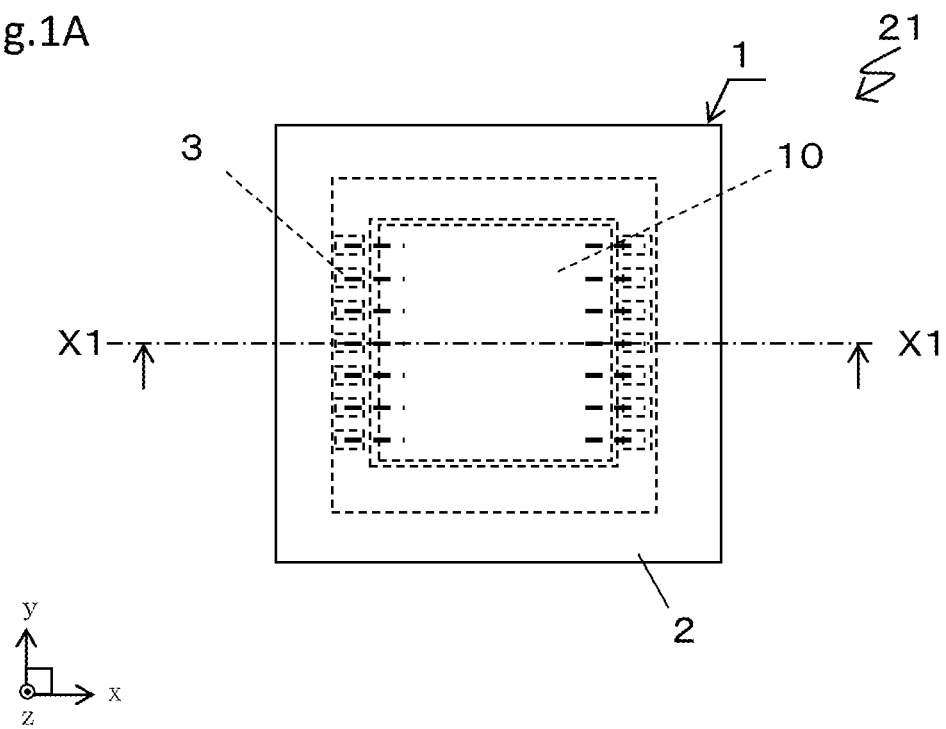
FIG. 1A is an external top view of an electronic device mounting board and an electronic package according to a first embodiment of the present invention.

Structures of Electronic Device Mounting Board and Electronic Package

Embodiments of the present invention will now be described by way of example with reference to the drawings. In the embodiments described below, an electronic package includes an electronic device mounted on an electronic device mounting board. An electronic module includes a housing or a member located on the upper surface of the electronic device mounting board or surrounding the electronic package. The electronic device mounting board, the electronic package, and the electronic module are herein defined using the orthogonal xyz coordinate system for ease of explanation, with the positive z-direction being defined upward, although they may actually have any faces being upward or downward.

First Embodiment

An electronic module 31, an electronic package 21, and an electronic device mounting board 1 according to a first embodiment of the present invention will now be described with reference to FIGS. 1A to 9B. In the present embodiment, FIGS. 1A to 2B show the electronic package 21, and FIGS. 3A and 3B show the electronic module 31. FIGS. 4A to 7B show internal layers of the electronic device mounting board 1. FIGS. 8A to 9B show a main part A. The electronic package 21 according to the present embodiment includes the electronic device mounting board 1 and an electronic device 10. In FIGS. 4A to 9B, the dotted lines indicate second through-cavities.

The electronic device mounting board 1 includes a substrate 2 on which the electronic device 10 is mountable. The substrate 2 includes a first layer 2a and a second layer 2b located on a lower surface of the first layer 2a. The first layer 2a has multiple first through-cavities 5a. The second layer 2b has at least one second through-cavity 5b overlapping the multiple first through-cavities 5a in a plan view. The multiple first through-cavities 5a and the second through-cavity 5b are continuous with one another.

The electronic device mounting board 1 includes the substrate 2 on which the electronic device 10 is mountable. The substrate 2 includes the first layer 2a and the second layer 2b located on the lower surface of the first layer 2a. As in the example shown in FIGS. 2A and 2B, the electronic device mounting board 1 may include an additional layer 2f, in addition to the first layer 2a and the second layer 2b. The electronic device mounting board 1 may include multiple additional layers 2f. The above electronic device 10 may be mounted on the upper or lower surface of the first layer 2a or the second layer 2b, or on the upper or lower surface of the additional layer 2f located on the upper surface of the first layer 2a or at the lower surface of the second layer 2b.

The insulating layers to be the first layer 2a, the second layer 2b, and the additional layer 2f are formed from, for example, an electrical insulating ceramic material or a resin. Examples of the resin include a thermoplastic resin.

Examples of the electrical insulating ceramic material used for the insulating layers forming the first layer 2a, the second layer 2b, and the additional layer 2f include sintered aluminum oxide, sintered mullite, sintered silicon carbide, sintered aluminum nitride, sintered silicon nitride, and sintered glass-ceramic. Examples of the resin used for the insulating layers forming the first layer 2a, the second layer 2b, and the additional layer 2f include a thermoplastic resin, an epoxy resin, a polyimide resin, an acryl resin, a phenolic resin, and a fluorine-based resin. Examples of the fluorine-based resin include a polytetrafluoroethylene resin.

Figure 1B:
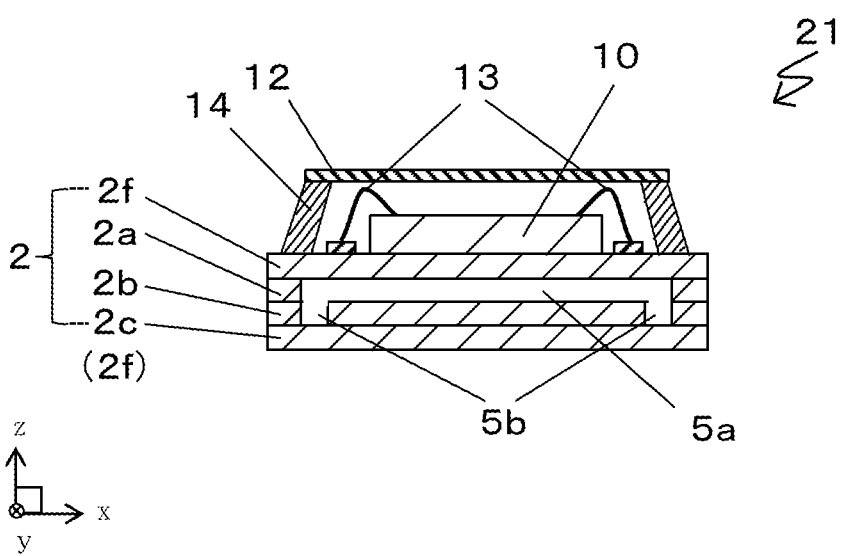
FIG. 1B is a cross-sectional view taken along line X1-X1 in FIG. 1A.
Figure 2A:
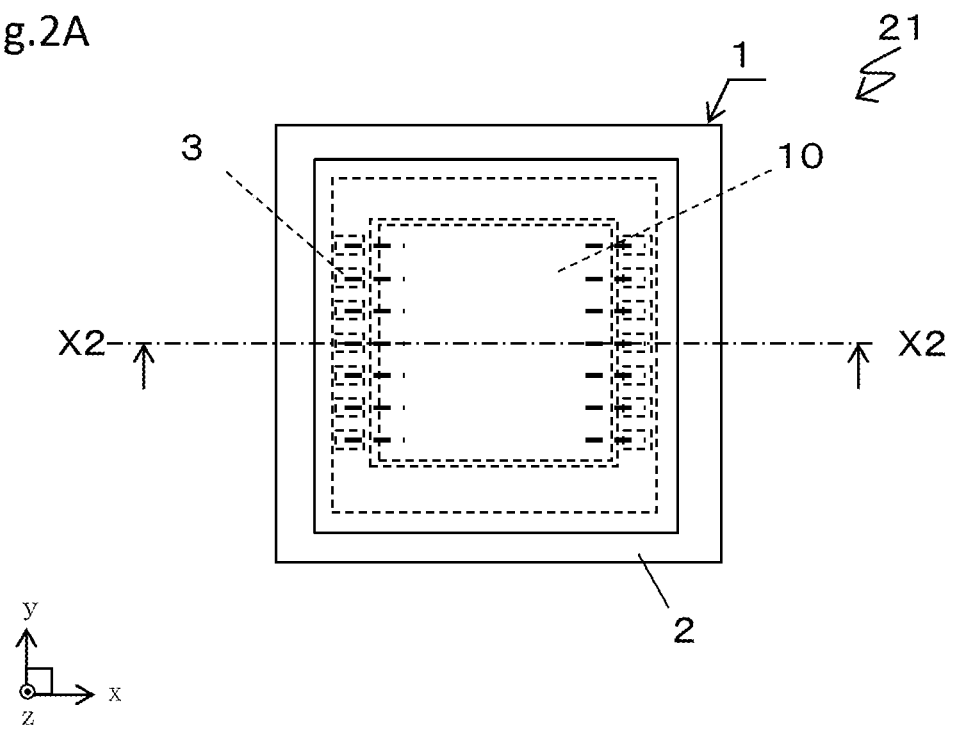
FIG. 2A is an external top view of an electronic device mounting board and an electronic package according to a modification of the first embodiment of the present invention.
Figure 2B:
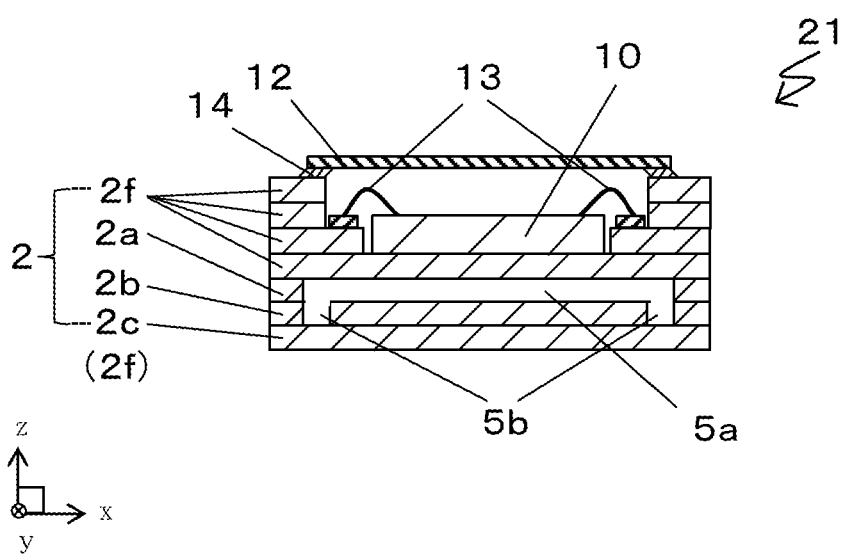
FIG. 2B is a cross-sectional view taken along line X2-X2 in FIG. 2A.
Figure 3A:
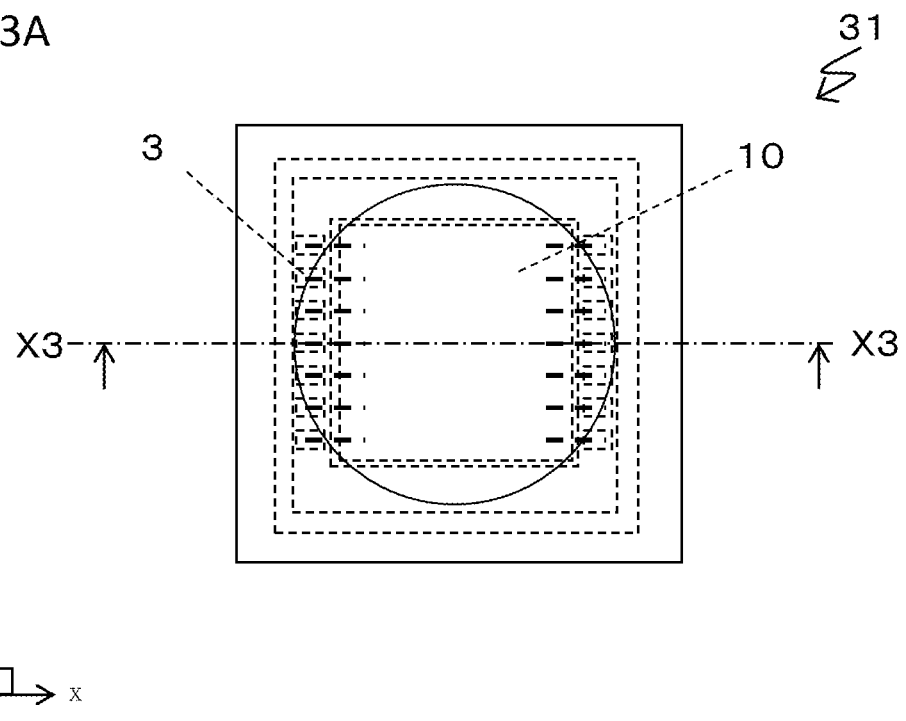
FIG. 3A is an external top view of an electronic module according to the first embodiment of the present invention.
Figure 3B:
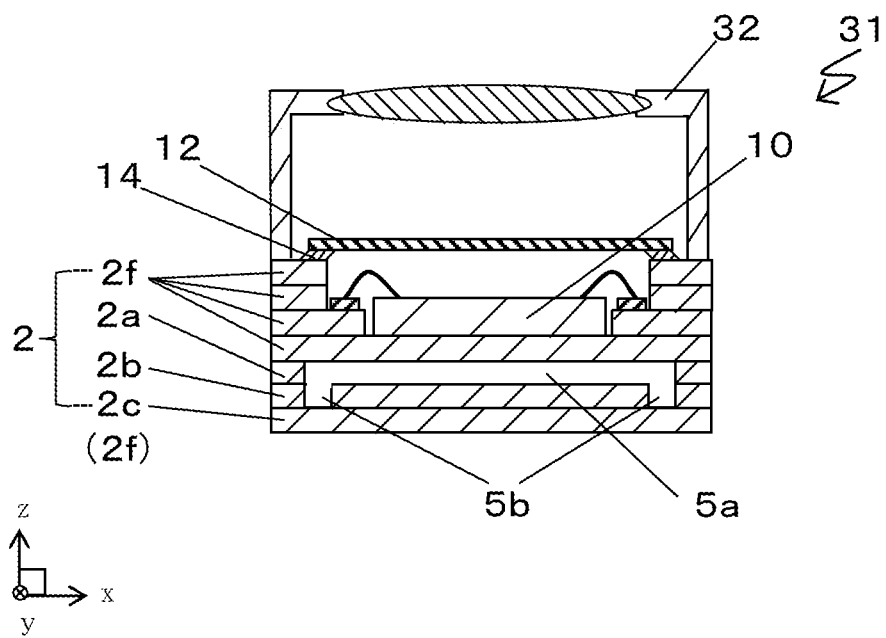
FIG. 3B is a cross-sectional view taken along line X3-X3 in FIG. 3A.

The substrate 2 including the first layer 2a, the second layer 2b, and the additional layers 2f may include seven insulating layers as shown in FIG. 2B, or may include six or less, or eight or more insulating layers. The use of six or less layers reduces the thickness of the electronic device mounting board 1. The use of eight or more layers increases the rigidity of the electronic device mounting board 1. As in the examples shown in FIGS. 2A to 3B, the insulating layers may have openings with different sizes. The openings may define a step, on which electrode pads 3 (described later) may be placed. The substrate 2 may have an opening as shown in FIGS. 2A to 3B, or may be a flat plate without an opening as shown in FIGS. 1A and 1B. The substrate 2 may be quadrangular, circular, or polygonal in a plan view.

The electronic device mounting board 1 has an outermost perimeter with a length of, for example, 0.3 mm to 10 cm on one side, and may be square or rectangular when it is quadrangular in a plan view. The electronic device mounting board 1 has a thickness of, for example, at least 0.2 mm.

The substrate 2 in the electronic device mounting board 1 may include, on its surface, the electrode pads 3 for connection with, for example, the electronic device 10. The substrate 2 may include electrodes for connection to external circuits on its upper surface, side surfaces, or lower surface. The electrodes for connection to external circuits may electrically connect the substrate 2 or the electronic package 21 to external circuit boards.

In addition to the electrode pads 3 and/or the electrodes for connection to external circuits, the substrate 2 may also include, on its upper surface or lower surface, inner wire conductors between the insulating layers, and feedthrough conductors that vertically connect the inner wire conductors. The inner wire conductors or feedthrough conductors may be uncovered on the surface of the substrate 2. The inner wire conductors or the feedthrough conductors may electrically connect the electrode pads 3 and/or the electrodes for connection to external circuits.

When the multiple insulating layers are formed from an electrical insulating ceramic material, the electrode pads 3, the electrodes for connection to external circuits, the inner wire conductors, and/or the feedthrough conductors are formed from tungsten (W), molybdenum (Mo), manganese (Mn), silver (Ag), or copper (Cu), or an alloy containing one or more of these metals. These components may be formed from copper. When the multiple insulating layers are formed from a resin, the electrode pads 3, the electrodes for connection to external circuits, the inner wire conductors, and/or the feedthrough conductors are formed from copper (Cu), gold (Au), aluminum (Al), nickel (Ni), molybdenum (Mo), or titanium (Ti), or an alloy containing one or more of these metals.

The uncovered surfaces of the electrode pads 3, the electrodes for connection to external circuits, the inner wire conductors, and/or the feedthrough conductors may be plated. The plating layer protects the surfaces of the electrodes for connection to external circuits, conductor layers, and the feedthrough conductors against oxidation. The plating layer also allows reliable electrical connection between the electrode pads 3 and the electronic device 10 with electronic device connectors 13, such as bonding wires. The plating layer may be, for example, a Ni plating layer with a thickness of 0.5 to 10 μm, and the Ni plating layer may further be coated with a gold (Au) plating layer with a thickness of 0.5 to 3 μm.

The first layer 2a in the electronic device mounting board 1 has the multiple first through-cavities 5a. The multiple first through-cavities 5a extend through the first layer 2a at least in a cross-sectional view. The first through-cavities 5a may extend through the first layer 2a alone, or may extend through two or more layers including an additional through-hole 5f, similar to the first through-cavities 5a, in the additional layer 2f located on the upper surface of the first layer 2a. The first through-cavities 5a in the first layer 2a and the additional through-hole 5f in the additional layer 2f may have different sizes. The first through-cavities 5a and the additional through-hole 5f may be, for example, quadrangular in a plan view.

At least two first through-cavities 5a may be provided. Each first through-cavity 5a may have the same or a different size, shape, or other profiles. The distance between adjacent first through-cavities 5a is not specified.

The second layer 2b in the electronic device mounting board 1 has the second through-cavity (or cavities) 5b overlapping the multiple first through-cavities 5a in a plan view. The second through-cavity 5b extends through the second layer 2b at least in a cross-sectional view. The second through-cavity 5b may extend through the second layer 2b alone, or may extend through two or more layers including an additional through-hole 5f, similar to the second through-cavity 5b, in the additional layer 2f located on the lower surface of the first layer 2a. The second through-cavity 5b in the second layer 2b and the additional through-hole 5f in the additional layer 2f may have different sizes.

At least one second through-cavity 5b or multiple second through-cavities 5b may be provided. The multiple second through-cavities 5b may each have the same or a different size, shape, or other profiles. The distance between adjacent second through-cavities 5b is not specified.

The multiple first through-cavities 5a and the second through-cavity (or cavities) 5b in the electronic device mounting board 1 are continuous with one another. In other words, adjacent first through-cavities 5a may be connected to each other with the second through-cavity 5b, defining a three-dimensional space.

An electronic device mounted on an electronic device mounting board may partly generate more heat in, for example, a sensing unit or a calculation unit than in other parts during operation. In response to the above issue, a flow channel may be provided to improve heat dissipation. However, a recent smaller electronic device mounting board has a smaller area and thus has a difficulty in providing a sufficient flow channel. This may cause insufficient dissipation of heat generated in a heat-generating part such as a sensing unit or a calculation unit in the electronic device, possibly causing breakage or malfunctions due to the heat of the electronic device.

In the present embodiment, the first through-cavities 5a in the first layer 2a and the second through-cavity 5b in the second layer 2b are continuous with one another. In other words, the first through-cavities 5a and the second through-cavity 5b define a three-dimensional flow channel inside the substrate 2. This structure allows the flow channel to be wider in the thickness direction of the substrate 2 and thus to have a larger volume. A smaller electronic device mounting board 1 can thus achieve heat dissipation.

Additionally, a recent highly functional electronic device mounted on an electronic device mounting board may generate more heat in a heat-generating part such as a sensing unit or a calculation unit than in other parts during operation. To achieve heat dissipation, the electronic device mounting board may have a broader flow channel, possibly transferring heat to a part that typically generates no heat (other parts). This structure may degrade the performance of the electronic device or affect its signals.

In the present embodiment, the first through-cavities 5a in the first layer 2a and the second through-cavity 5b in the second layer 2b are continuous with one another. In other words, the first through-cavities 5a and the second through-cavity 5b define a three-dimensional flow channel inside the substrate 2. This structure allows the flow channel to be wider in the thickness direction and thus to have a larger volume. Additionally, the second through-cavity 5b located at a boundary with a part that typically generates no heat (other parts) allows heat generated in a heat-generating part to be transferred to a lower layer or the flow channel, instead of being transferred to the part that typically generates no heat (other parts). This structure reduces heat transferred to the part that typically generates no heat (other parts) while achieving heat dissipation, and thus reduces malfunctions of the electronic device 10.

The first through-cavities 5a, the second through-cavity 5b, and the additional through-hole 5f may be filled with a liquid heat-dissipating substance such as oil or with another fluid such as a gas. As described later, the first through-cavities 5a, the second through-cavity 5b, and the additional through-hole 5f may be connected to the outside of the substrate 2 with a channel 6. The liquid or gas described above may be circulated through the channel 6.

The substrate 2 may include two or more sets of flow channels, each including multiple first through-cavities 5a and multiple second through-cavities 5b that are continuous with the first through-cavities 5a. In other words, more flow channels may be provided, depending on the size, the location, and the number of heat-generating parts.

A flow channel herein refers to an area defined by a third layer 2c and/or the additional layer 2f located on the upper or lower ends of the first through-cavities 5a and the second through-cavities 5b. In other words, the flow channel is a space surrounded by the first layer 2a, the second layer 2b, the third layer 2c, and/or the additional layer 2f. The flow channel refers to a hollow space defined by the first through-cavities 5a and the second through-cavities 5b in the substrate 2.

The first through-cavities 5a, the second through-cavities 5b, and/or the additional through-hole 5f may include metal layers on their side walls. The metal layers may have higher thermal conductivity than the substrate 2 to further improve heat dissipation. The metal layers on the side surfaces of the first through-cavities 5a, the second through-cavities 5b, and/or the additional through-hole 5f may be insulated from a ground potential connected to the electronic device 10 in the substrate 2. This structure reduces malfunctions of the electronic device 10 and troubles resulting from changes in the resistance caused by heat.

The shapes and locations of the first through-cavities 5a are not completely the same as those of the second through-cavities 5b in a plan view. In other words, the first through-cavities 5a and the second through-cavities 5b partially do not overlap each other in a plan view. This structure allows the first through-cavities 5a and the second through-cavities 5b to be continuous with each other, while improving heat dissipation.

As shown in FIGS. 1A to 3B, the second layer 2b may have, on its lower surface, the third layer 2c or the additional layer 2f, defining a flow channel. The third layer 2c or the additional layer 2f may contain the same material as the first layer 2a and/or the second layer 2b or be formed from a different material. The second layer 2b and the third layer 2c may be sintered together or bonded together using, for example, a bond.

Figure 4A:
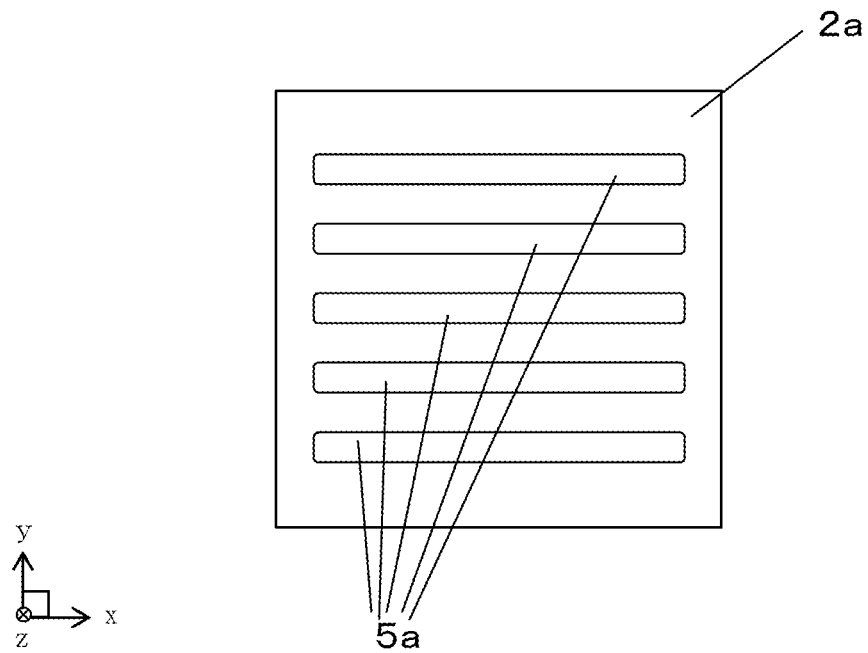
FIG. 4A is a plan view of an example first layer in the electronic device mounting board according to the first embodiment of the present invention.
Figure 4B:
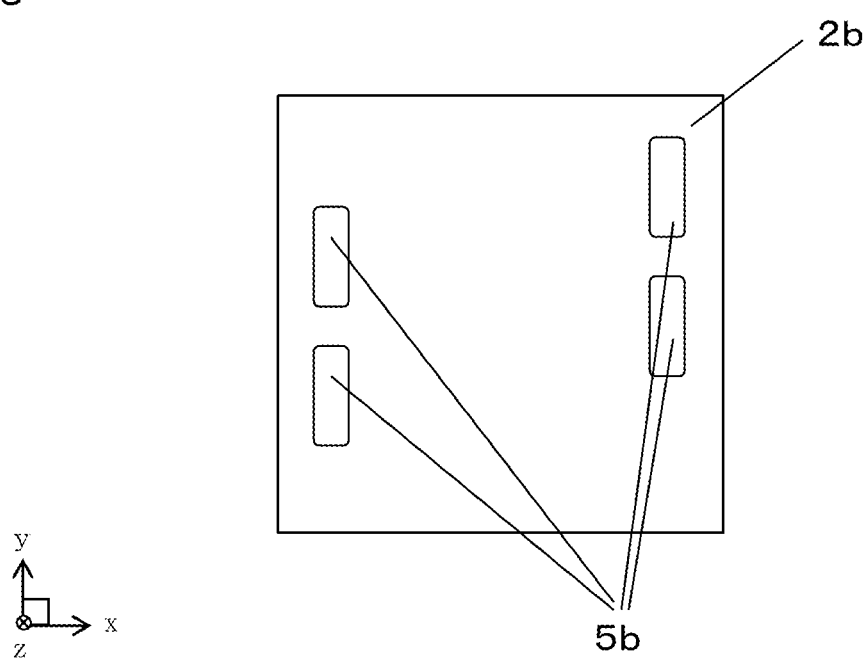
FIG. 4B is a plan view of an example second layer as an internal layer in the electronic device mounting board according to the first embodiment.

FIGS. 4A and 4B are plan views of the first layer 2a and the second layer 2b. FIGS. 5A to 7B are transparent plan views of the first layer 2a and the second layer 2b stacked together. Although FIGS. 4A to 7B simply show the first through-cavities 5a and the second through-cavities 5b, without showing other components including wiring conductors and feedthrough conductors, such components may be included in actual products.

Figure 5A:
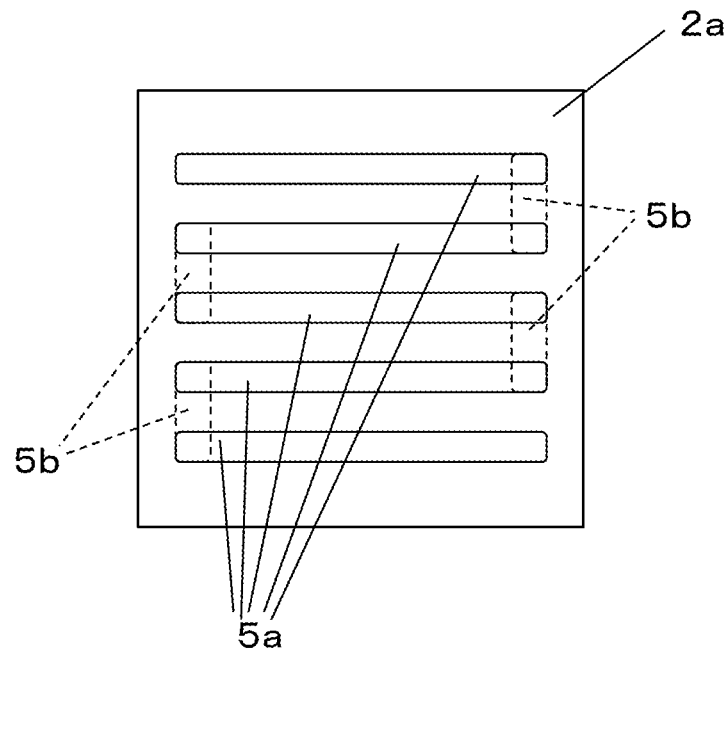
FIG. 5A is a transparent top view of the electronic device mounting board according to the first embodiment shown in FIGS. 4A and 4B.

FIGS. 4A and 4B show multiple first through-cavities 5a in the first layer 2a and multiple second through-cavities 5b in the second layer 2b. FIG. 5A is a transparent plan view of the first through-cavities 5a and the second through-cavities 5b overlap each other. The first through-cavities 5a and the second through-cavities 5b combined together are continuous with one another, defining a flow channel. This structure allows the flow channel to be wider in the thickness direction of the substrate 2 and thus to have a larger volume. A smaller electronic device mounting board 1 can thus achieve heat dissipation.

As shown in FIGS. 4A to 5B, the multiple first through-cavities 5a may be located parallel to one another. With the multiple first through-cavities 5a located parallel to one another, the second through-cavities 5b can be located easily to connect adjacent first through-cavities 5a with each other. This structure also increases the density of the first through-cavities 5a in portions in which heat dissipation is to be provided, thus further improving heat dissipation. With the first through-cavities 5a located parallel to one another, a liquid or fluid externally circulated to the substrate 2 through the channel 6 is less likely to be blocked at corners or other portions of the cavities. This thus achieves heat dissipation.

In the example shown in FIG. 5A, the first through-cavities 5a and the second through-cavities 5b are rectangular in a plan view. The longer sides of the first through-cavities 5a are longer than those of the second through-cavities 5b. The first through-cavities 5a can thus have a larger volume than the second through-cavities 5b. When, for example, the first through-cavities 5a are located nearer a surface on which the electronic device 10 is mounted than the second through-cavities 5b, heat dissipation is improved in a portion nearer the electronic device 10. This structure allows the flow channel to be wider in the thickness direction of the substrate 2 and thus to have a larger volume. A smaller electronic device mounting board 1 can thus achieve heat dissipation.

In the example shown in FIG. 5A, the first through-cavities 5a and the second through-cavities 5b are sequentially continuous with one another into a single space. In other words, the first through-cavities 5a and the second through-cavities 5b are continuously connected together. A liquid or gas to be externally circulated to the substrate 2 through the channel 6 (described later) can flow from the inlet to the outlet through the channel 6. The liquid or gas is less likely to be retained and block the flow for heat dissipation. This achieves heat dissipation. Additionally, this structure allows heat to move in one direction and thus reduces the likelihood that retained heat causes uneven heat dissipation when a liquid or gas is not externally circulated to the substrate 2.

Figure 5B:
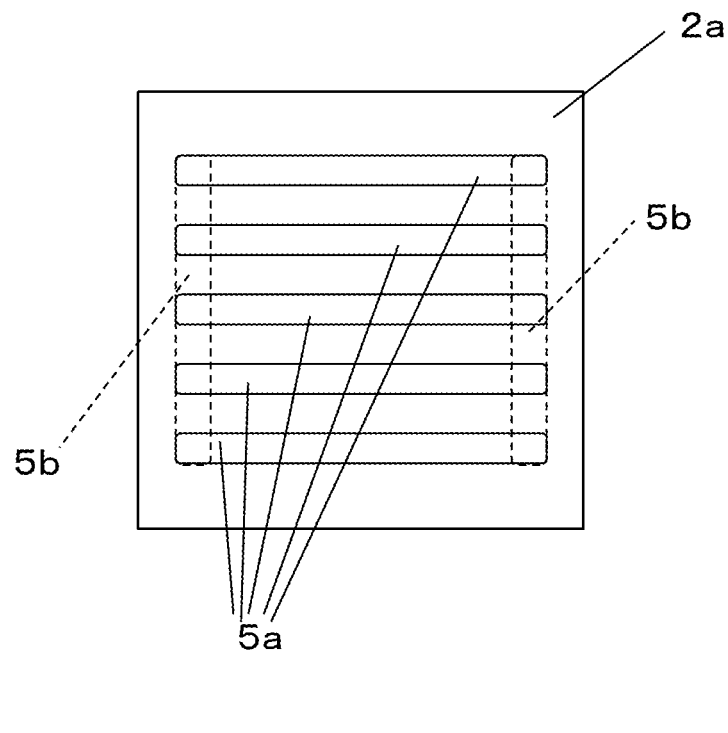
FIG. 5B is a transparent top view of an electronic device mounting board according to another embodiment.

In the example shown in FIG. 5B, three or more first through-cavities 5a all have end portions connected to one another with the second through-cavities 5b. An end portion refers to a portion including an end and a portion around the end. This structure allows the second through-cavities 5b to have a larger volume when three or more first through-cavities 5a are provided. Heat dissipation is thus improved further. The second through-cavities 5b connecting end portions of three or more first through-cavities 5a increase the volume of the cavities extending in Z-direction. When, for example, the electronic device 10 is arranged adjacent to the first through-cavities 5a, the above structure allows easy transfer of heat from the electronic device 10 to the second through-cavities 5b and the additional layer 2f in contact with the second through-cavities 5b. Heat dissipation is thus improved further.

Figure 6A:
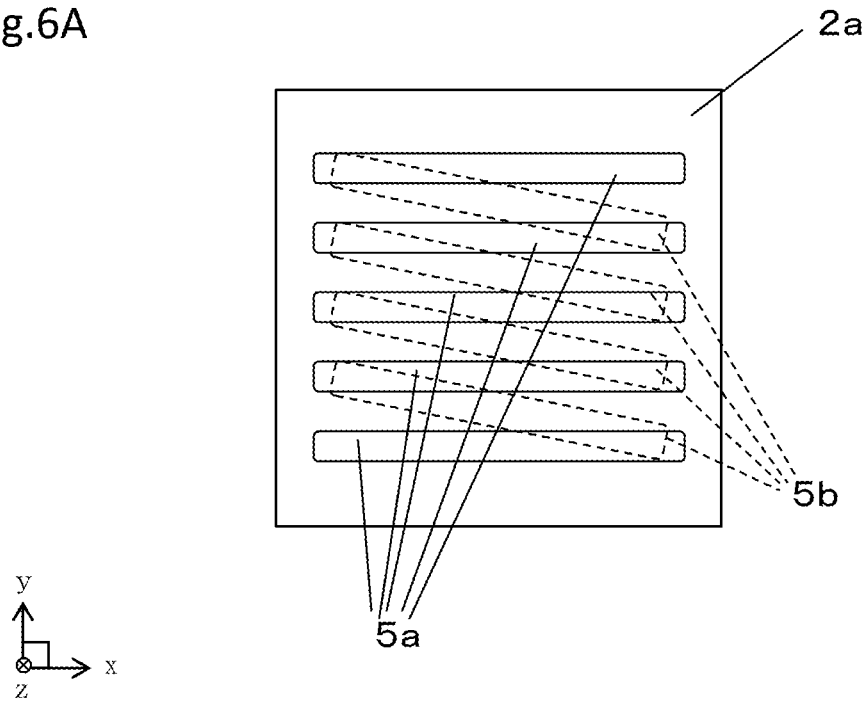
FIG. 6A is a transparent top view of an electronic device mounting board according to a modification of the first embodiment.
Figure 6B:
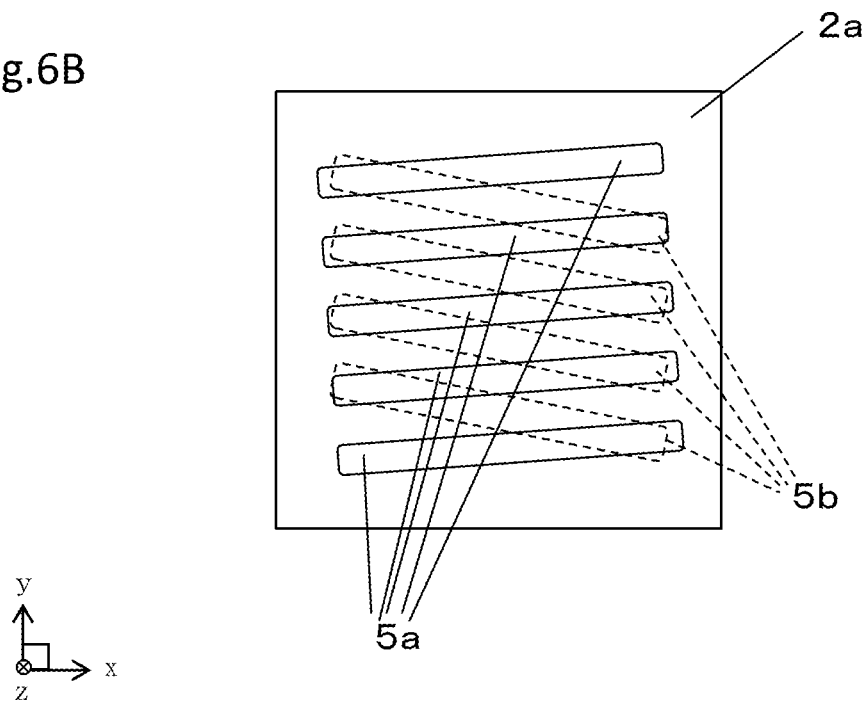
FIG. 6B is a transparent top view of an electronic device mounting board according to another modification of the first embodiment.

In the examples shown in FIGS. 6A and 6B, the second through-cavities 5b are located to overlap the end portions of adjacent first through-cavities 5a. In other words, each second through-cavity 5b overlaps an end portion of one adjacent first through-cavity 5a and an opposite end portion of another adjacent first through-cavity 5a. In this structure, the second through-cavities 5b have a larger volume, and the first through-cavities 5a and the second through-cavities 5b are sequentially continuous with one another into a single space. This allows the flow channel (the first through-cavities 5a and the second through-cavities 5b) to have a larger volume, thus improving heat dissipation. Additionally, a liquid or gas to be externally circulated to the substrate 2 through the channel 6 can flow from the inlet to the outlet through the channel 6. In this structure, the liquid or gas is less likely to be retained and block the flow for heat dissipation, thus achieving heat dissipation. The structure produces these advantageous effects and improves heat dissipation.

Moreover, the second through-cavities 5b having a larger volume allow easy transfer of heat from the second through-cavities 5b to the third layer 2c or the additional layer 2f. This allows transfer of more heat to, for example, an external circuit board, thus allowing the electronic device mounting board 1 to have improved heat dissipation.

In the example shown in FIG. 6B, the first through-cavities 5a are located obliquely with respect to the periphery of the substrate 2, unlike in the example shown in FIG. 6A. The first through-cavities 5a located obliquely with respect to the periphery of the substrate 2 can have a larger volume. In this structure, the second through-cavities 5b have a larger volume, and the first through-cavities 5a and the second through-cavities 5b are sequentially continuous with one another into a single space. The structure produces these advantageous effects and improves heat dissipation.

Figure 7A:
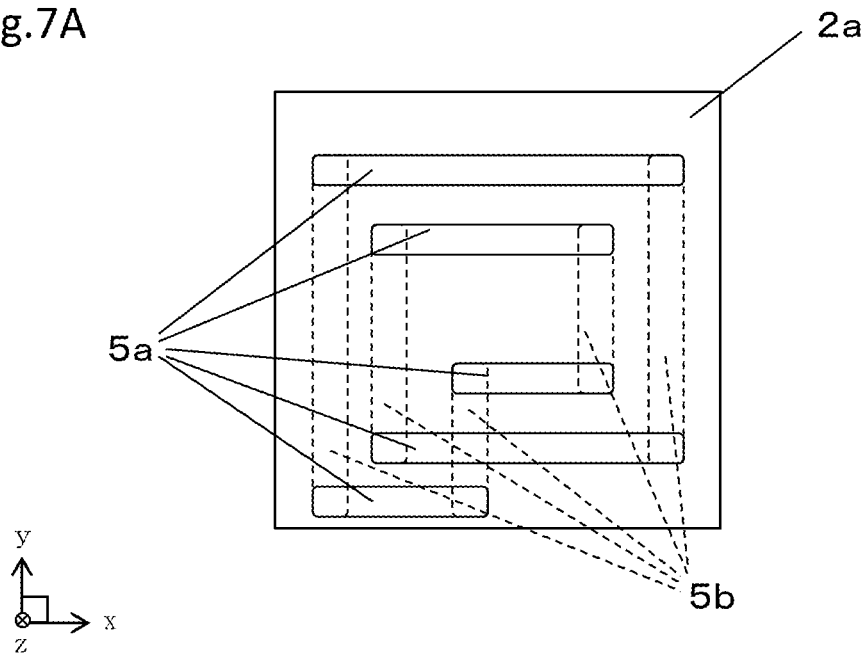
FIG. 7A is a transparent top view of an electronic device mounting board according to still another modification of the first embodiment.
Figure 7B:
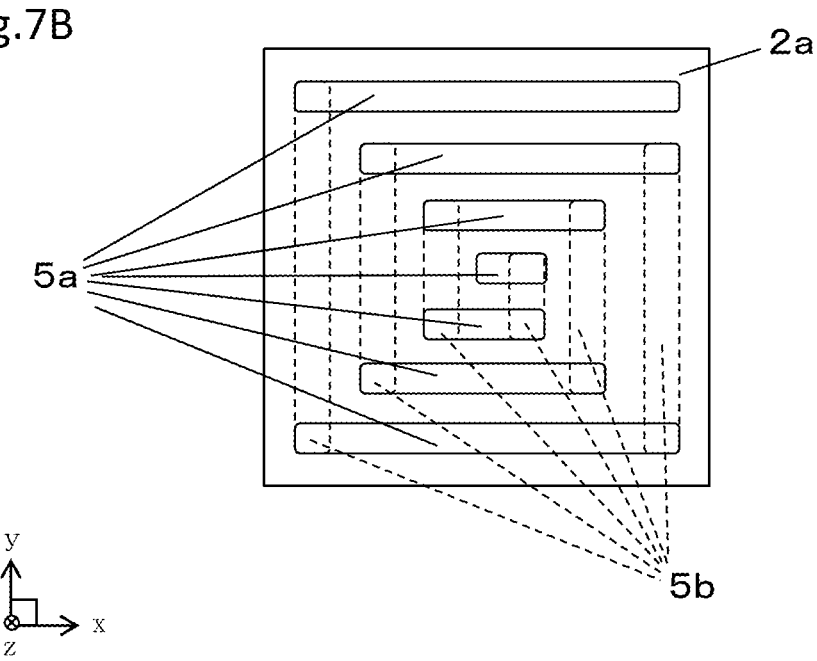
FIG. 7B is a transparent top view of an electronic device mounting board according to still another modification of the first embodiment.
Figure 8A:
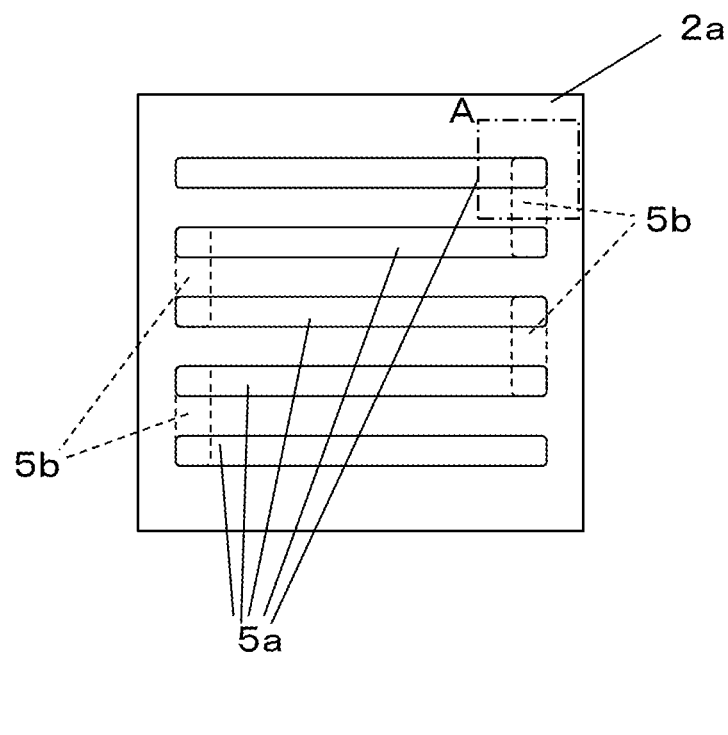
FIG. 8A is a transparent top view of the internal layer in the electronic device mounting board according to the first embodiment of the present invention.
Figure 8B:
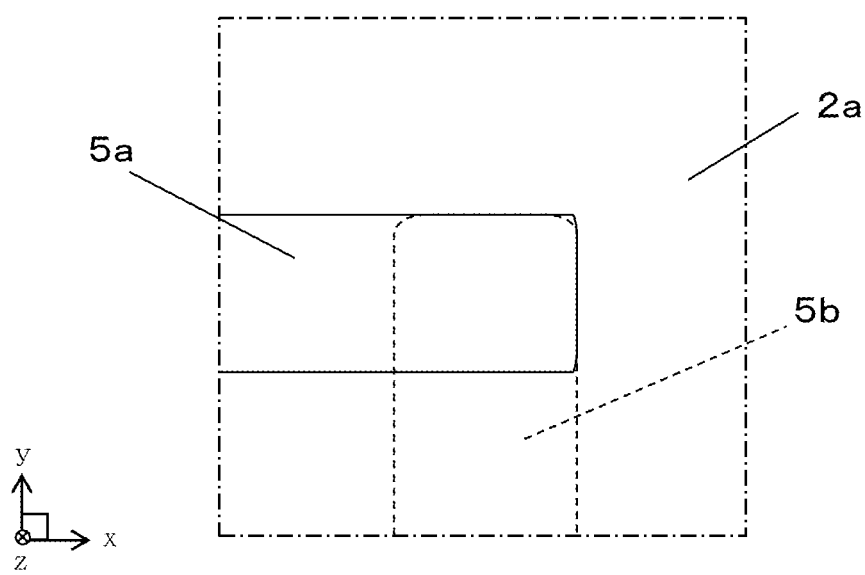
FIG. 8B is an enlarged transparent view of a main part A in FIG. 8A.

In the examples shown in FIGS. 7A and 7B, the first through-cavities 5a and the second through-cavities 5b are continuous with one another into a spiral in a plan view. This structure allows the substrate 2 to dissipate heat entirely on an XY plane in a plan view, using the first layer 2a and the second layer 2b. In this manner, the entire substrate 2 dissipates heat.

As in the example shown in FIG. 7A, the first through-cavities 5a and the second through-cavities 5b may form a loop. This structure allows the flow channel to be wider in the thickness direction of the substrate 2 and thus to have a larger volume. A smaller electronic device mounting board 1 can thus achieve heat dissipation. A liquid or gas can be externally circulated to the substrate 2 through the channel 6.

As in the example shown in FIG. 7B, the first through-cavities 5a and the second through-cavities 5b may be continuous with one another into a gradually expanding spiral (radially expanding spiral). Typically, heat spreads radially. Thus, the first through-cavities 5a and the second through-cavities 5b formed in a radially expanding spiral can dissipate heat accordingly as the heat spreads, thus achieving heat dissipation. This structure allows the flow channel to be wider in the thickness direction of the substrate 2 and thus to have a larger volume, achieving heat dissipation more effectively.

The electronic device 10 can have a heat-generating part near the center of the spiral flow channel (the first through-cavities 5a and the second through-cavities 5b) in a plan view. This allows transfer of heat in the spiral flow channel to the lower surface. This structure reduces heat transferred from the heat-generating part of the electronic device 10 to other parts.

FIGS. 8B to 9B are enlarged transparent plan views of a main part A of the first layer 2a and the second layer 2b stacked together. In the example shown in FIG. 8B, the second through-cavity 5b has an end portion inward from or at the overlapping position with the periphery of the outermost first through-cavity 5a in a plan view. The structure including the end portions allows the second through-cavities 5b to be within the area of the first through-cavities 5a, allowing the multiple first through-cavities 5a to be at a smaller distance between them. This structure increases the density of the first through-cavities 5a. The structure including the second through-cavities 5b improves heat dissipation, while producing the advantageous effects of the embodiments of the present invention.

The first through-cavities 5a have end portions inward from or at the overlapping position with the periphery of the outermost second through-cavities 5b in a plan view. The structure including the end portions allows the end portions of the first through-cavities 5a to be within the area of the second through-cavities 5b. The second through-cavities 5b are thus located nearer the periphery of the substrate 2 in a plan view. The end portions of the first through-cavities 5a are thus located nearer the periphery of the substrate 2. The first through-cavities 5a thus have a larger volume. This structure allows the flow channel to be wider in the thickness direction of the substrate 2 and allows the first through-cavities 5a to have a larger volume in the planar direction. A smaller electronic device mounting board 1 can thus have improved heat dissipation.

Figure 9A:
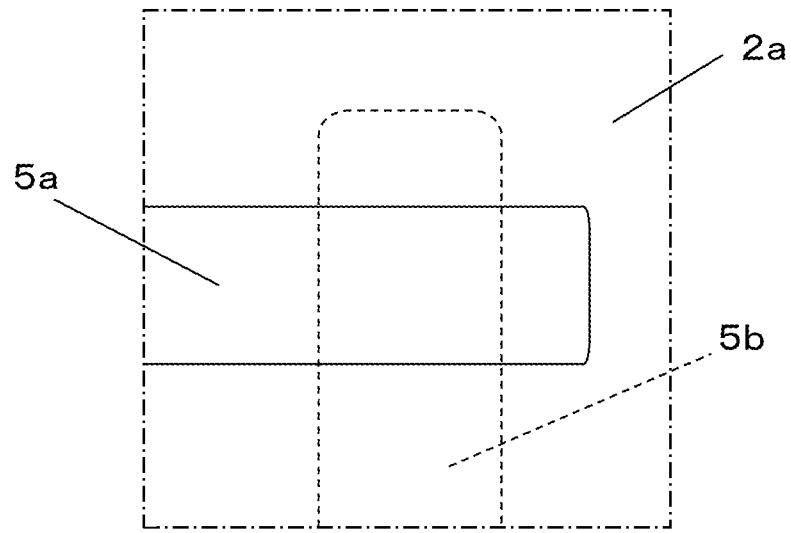
FIGS. 9A and 9B are enlarged transparent views of a main part A of an electronic device mounting board according to a modification of the first embodiment of the present invention.
Figure 9A:
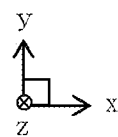

In the example shown in FIG. 9A, the second through-cavity 5b has an end portion outward from the periphery of the outermost first through-cavity 5a in a plan view. For example, a second layer 2b may block circulation of a liquid or gas for heat dissipation when its portions outward from the end portions of the second through-cavities 5b protrude inwardly in the first through-cavities 5a. In contrast, the structure shown in FIG. 9A is less likely to block circulation of a cooling liquid or gas. This structure achieves heat dissipation, while producing the advantageous effects of the embodiments of the present invention.

When the second through-cavities 5b have end portions inward from the periphery of the outermost first through-cavities 5a in a plan view, portions of the second layer 2b outward from the end portions of the second through-cavities 5b protrude inwardly in the first through-cavities 5a. When, for example, heat rapidly generated in the electronic device 10 is retained in the first through-cavities 5a, the second layer 2b including the protruding portions expands thermally. In this case, the second layer 2b, under limited support from upper and lower layers, may be displaced unevenly. This may cause cracks or breaks in the second layer 2b. In contrast, the structure shown in FIG. 9A reduces such uneven displacement caused by thermal expansion of the second layer 2b. The above structure can thus more reliably reduce cracks or breaks in the second layer 2b, while producing the advantageous effects of the embodiments of the present invention.

In the example shown in FIG. 9A, the first through-cavity 5a has an end portion outward from the periphery of the outermost second through-cavity 5b in a plan view. For example, a first layer 2a may block circulation of a liquid or gas for heat dissipation when its portions outward from the end portions of the first through-cavities 5a protrude inwardly in the second through-cavities 5b. In contrast, the structure shown in FIG. 9A is less likely to block circulation of the liquid or gas. This structure achieves heat dissipation, while producing the advantageous effects of the embodiments of the present invention.

When the first through-cavities 5a have end portions inward from the periphery of the outermost second through-cavities 5b in a plan view, portions of the first layer 2a outward from the end portions of the first through-cavities 5a protrude inwardly in the second through-cavities 5b. When, for example, heat rapidly generated in the electronic device 10 is retained in the first through-cavities 5a, the first layer 2a including the protruding portions expands thermally. In this case, the first layer 2a, which receives limited support from upper and lower layers, may be displaced unevenly. This may cause cracks or breaks in the first layer 2a. In contrast, the structure shown in FIG. 9A reduces such uneven displacement caused by thermal expansion of the first layer 2a. The above structure can thus reduce cracks or breaks in the first layer 2a, while producing the advantageous effects of the embodiments of the present invention.

The structure according to any of the above embodiments reduces portions in which the first through-cavities 5a and the second through-cavities 5b do not overlap each other in a plan view when the first layer 2a and the second layer 2b are misaligned during manufacture of the substrate 2. In the structure, the first through-cavities 5a and the second through-cavities 5b can be more reliably continuous with one another sequentially, thus achieving heat dissipation. When the first layer 2a and the second layer 2b are formed from an electrical insulating ceramic material, the above structure allows the first layer 2a and the second layer 2b to receive more stress in the process of stacking and pressing them together. This reduces delamination or other defects. Although the first through-cavity 5a has its end located outward from the second through-cavity 5b and the second through-cavity 5b has its end located outward from the first through-cavity 5a in FIG. 9A, either the first through-cavity 5a or the second through-cavity 5b may satisfy the condition shown in FIG. 9A.

Figure 9B:
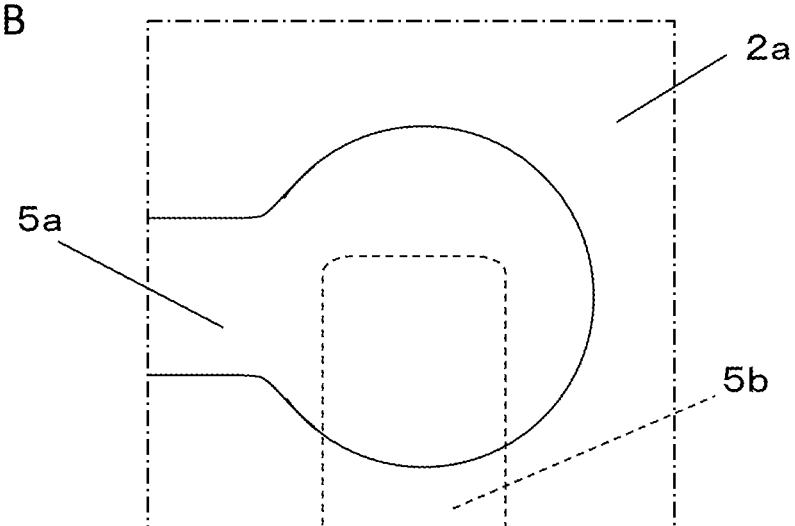
Figure 9B:
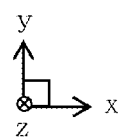

In the example shown in FIG. 9B, the first through-cavity 5a has a curved end portion in a plan view. This structure reduces portions in which the first through-cavities 5a and the second through-cavities 5b do not overlap each other in a plan view when the first layer 2a and the second layer 2b are misaligned during manufacture of the substrate 2. The structure having the curved end portion reduces portions in which the first through-cavities 5a and the second through-cavities 5b do not overlap each other in a plan view when misalignment occurs in any direction. In the structure, the first through-cavities 5a and the second through-cavities 5b can be more reliably continuous with one another sequentially, thus producing the advantageous effects of the embodiments of the present invention and improving heat dissipation.

The second through-cavity 5b may have a curved end portion in a plan view. The structure having the second through-cavity 5b having a curved end portion as the first through-cavity 5a reduces portions in which the first through-cavities 5a and the second through-cavities 5b do not overlap each other in a plan view when misalignment occurs in any direction. In the structure, the first through-cavities 5a and the second through-cavities 5b can be more reliably continuous with one another sequentially, thus producing the advantageous effects of the embodiments of the present invention and achieving heat dissipation.

The curved end portion of the first through-cavity 5a or the second through-cavity 5b receives the flow of a liquid or gas to be circulated in the first through-cavities 5a and the second through-cavities 5b for heat dissipation, and smoothly transfers the liquid or gas to an upper or lower layer. This structure is less likely to block circulation of the liquid or gas. This structure achieves heat dissipation, while producing the advantageous effects of the embodiments of the present invention.

Both the first through-cavity 5a and the second through-cavity 5b may have a curved end portion. This structure also produces the advantageous effects described above. The curved end portions of both the first through-cavity 5a and the second through-cavity 5b are less likely to block circulation of the flow of a liquid or gas in the first through-cavities 5a and the second through-cavities 5b for heat dissipation. This structure is less likely to block circulation of the liquid or gas. This structure achieves heat dissipation, while producing the advantageous effects of the embodiments of the present invention.

Structure of Electronic Package

FIGS. 2A and 2B show an example of the electronic package 21. The electronic package 21 includes the electronic device mounting board 1 and the electronic device 10 mounted on the upper or lower surface of the electronic device mounting board 1.

The electronic package 21 includes the electronic device mounting board 1 and the electronic device 10 mounted on the electronic device mounting board 1. Examples of the electronic device 10 include an imaging device such as a charge-coupled device (CCD) or a complementary metal-oxide semiconductor (CMOS) device, a light-emitting device such as a light-emitting diode (LED), a device for sensing pressure, air pressure, acceleration, or a gyro sensor, and an integrated circuit. The electronic device 10 may be mounted on the upper surface of the substrate 2 with an adhesive. The adhesive is, for example, silver epoxy or a thermosetting resin.

The electronic device 10 may be electrically bonded to the electronic device mounting board 1 with the electronic device connectors 13 including, for example, wire bonding, solder balls, and gold bumps.

The electronic package 21 may include a lid 12 that covers the electronic device 10 and is bonded to the upper surface of the electronic device mounting board 1. The electronic device mounting board 1 may have the lid 12 connected to the upper surface of a frame portion in the substrate 2 or include a frame that supports the lid 12 and surrounds the electronic device 10 on the upper surface of the substrate 2. The frame and the substrate 2 may be formed from the same material or different materials.

When the frame and the substrate 2 are formed from the same material, they may be formed integrally with the uppermost insulating layer by, for example, forming the frame opening in the substrate 2. In another example, the frame and the substrate 2 may be bonded together with a separately prepared brazing material.

When the substrate 2 and the frame are formed from different materials, the frame may be formed from, for example, the same material as the material for a lid bond 14 for bonding the lid 12 to the substrate 2. In this case, the lid bond 14 is thick enough to function both as a bonding member and the frame (as the support for the lid 12). Examples of the lid bond 14 include a thermosetting resin and a brazing material formed from glass with a low melting point or a metal component. The frame and the lid 12 may be formed from the same material. In this case, the frame and the lid 12 may be formed as one piece.

The lid 12 is formed from a highly transparent material such as a glass material for, for example, an imaging device used as the electronic device 10, such as a CMOS or CCD, or a light-emitting device, such as an LED. The lid 12 may be formed from a metallic material, a ceramic material, or an organic material when, for example, the electronic device 10 is an integrated circuit.

The lid 12 is bonded to the electronic device mounting board 1 with the lid bond 14. Examples of the material for the lid bond 14 include a thermosetting resin and a brazing material formed from glass with a low melting point or a metal component.

The electronic package 21 includes the electronic device mounting board 1 shown in FIGS. 2A and 2B, and thus achieves dissipation of heat generated in the electronic device 10. This structure thus lowers the likelihood that the electronic device malfunctions under heat generated during operation.

When the electronic device 10 in the electronic package 21 includes a heat-generating part, the first through-cavities 5a and the second through-cavities 5b may overlap the heat-generating part in a plan view. This structure allows heat from the heat-generating part in the electronic device 10 to be dissipated through the first through-cavities 5a and the second through-cavities 5b located adjacent to the heat-generating part, enhancing the above advantageous effects.

Structure of Electronic Module

FIGS. 3A and 3B show an example of the electronic module 31 including the electronic device mounting board 1. The electronic module 31 includes the electronic package 21 and a housing 32 for covering the upper surface of the electronic package 21 or for covering the electronic package 21. An imaging module will now be described as an example.

The electronic module 31 may include the housing 32 (lens holder). The housing 32 improves hermetic sealing or reduces external stress directly applied to the electronic package 21. The housing 32 is formed from, for example, a resin or a metal material. The lens holder as the housing 32 may incorporate one or more lenses formed from, for example, a resin, a liquid, glass, or quartz. The housing 32 may include, for example, a drive for vertical or horizontal driving and may be electrically connected to, for example, the pads on the surface of the electronic device mounting board 1 with a bond such as solder.

The housing 32 may have an opening in at least one of the four sides in a plan view. Through the opening in the housing 32, an external circuit board may be placed for electrical connection to the electronic device mounting board 1. After the external circuit board is electrically connected to the electronic device mounting board 1, the opening in the housing 32 may be sealed with a sealant, such as a resin, to hermetically seal the inside of the electronic module 31.

The electronic module 31 including the electronic package 21 and the electronic device mounting board 1 shown in FIGS. 3A and 3B achieves dissipation of heat generated in the electronic device 10. This structure thus lowers the likelihood that the electronic device malfunctions under heat generated during operation.

Method for Manufacturing Electronic Device Mounting Board and Electronic Package An example method for manufacturing the electronic device mounting board 1 and the electronic package 21 according to the present embodiment will now be described. The manufacturing method for the substrate 2 described below uses a multi-piece wiring substrate.

(1) A ceramic green sheet to be the substrate 2 is prepared first. To obtain the substrate 2 formed from, for example, sintered aluminum oxide ($Al_2O_3$), powders such as silica ($SiO_2$), magnesia (MgO), or calcium oxide (CaO) are added as sintering aids to $Al_2O_3$ powder, and an appropriate binder, an appropriate solvent, and an appropriate plasticizer are added to the powder mixture, which is then kneaded to form slurry. The slurry is then shaped into a sheet using a doctor blade or by calendaring to obtain a ceramic green sheet for a multi-piece substrate.

The substrate 2 formed from, for example, a resin may be molded using a mold having a predetermined shape by transfer molding or injection molding. The substrate 2 may be formed from a glass epoxy resin, which is a base glass fiber impregnated with a resin. In this case, the base glass fiber is impregnated with a precursor of an epoxy resin. The epoxy resin precursor is then cured by heat at a predetermined temperature to form the substrate 2.

(2) A metal paste is then applied or placed, by screen printing or other techniques, to the areas to be the electrode pads 3, the electrodes for connection to external circuits, the inner wire conductors, and the feedthrough conductors in the ceramic green sheet obtained through the above process (1). The metal paste is prepared by adding an appropriate solvent and an appropriate binder to the metal powder containing the above metal materials and then kneading the mixture to have an appropriate viscosity. The metal paste may contain glass or ceramic to increase the strength of bonding with the substrate 2.

When the substrate 2 is formed from a resin, the electrode pads 3, the electrodes for connection to external circuits, the inner wire conductors, and the feedthrough conductors can be prepared by, for example, sputtering or vapor deposition. In some embodiments, these components may be formed by plating after a metal film is formed on the surface.

(3) The green sheet is then processed using, for example, a die. In this process, an opening or a notch may be formed in a predetermined portion of the green sheet to be the substrate 2. Also, the first through-cavities 5a and the second through-cavities 5b may be formed at predetermined positions of the first layer 2a and the second layer 2b using a die or laser, or by punching.

(4) The ceramic green sheets to be the insulating layers for the first layer 2a and the second layer 2b are then stacked and pressed. The green sheets to be the insulating layers may then be stacked to prepare a ceramic green sheet laminate to be the substrate 2 (electronic device mounting board 1). This process may also include forming the first through-cavities 5a and the second through-cavities 5b at predetermined positions of the stacked ceramic green sheets as the first layer 2a and the second layer 2b using a die or laser, or by punching. In some embodiments, multiple ceramic green sheets with through-holes at positions to be the first through-cavities 5a and the second through-cavities 5b may be prepared and stacked on one another to form the first layer 2a and the second layer 2b including the multiple layers. The additional through-hole 5f may be formed in the additional layer 5f in the same manner as described above.

(5) This ceramic green sheet laminate is then fired at about 1500 to 1800° C. to obtain a multi-piece wiring substrate including an array of substrates 2 (electronic device mounting boards 1). In this process, the metal paste described above is fired together with the ceramic green sheet to be the substrate 2 (electronic device mounting board 1) to form the electrode pads 3, the electrodes for connection to external circuits, the inner wire conductors, and the feedthrough conductors.

(6) The multi-piece wiring substrate resulting from the firing process is then cut into multiple substrates 2 (electronic device mounting boards 1). In this cutting process, separation grooves may be formed along the outer edge of each of the substrates 2 (electronic device mounting boards 1), and the multi-piece wiring substrate may be split along the separation grooves into the multiple substrates 2. In other embodiments, the multi-piece wiring substrate may be cut along the outer edge of each of the substrates 2 (electronic device mounting boards 1) by, for example, slicing. The separation grooves may be formed to have a depth smaller than the thickness of the multi-piece wiring substrate using a slicer after the firing process. In still other embodiments, the separation grooves may be formed by pressing a cutter blade onto the ceramic green sheet laminate that is to be the multi-piece wiring substrate or by cutting the ceramic green sheet laminate to a depth smaller than its thickness with a slicer. Before or after the multi-piece wiring substrate is split into multiple substrates 2 (electronic device mounting boards 1), the electrode pads 3, the pads for connection to external circuits, and the uncovered wiring conductors may be plated by electroplating or electroless plating.

(7) The electronic device 10 is then mounted on the upper or lower surface of the electronic device mounting board 1. The electronic device 10 is electrically connected to the electronic device mounting board 1 with the electronic device connectors 13, such as bonding wires. The electronic device 10 may be fixed onto the electronic device mounting board 1 with an adhesive or another bond applied to either the electronic device 10 or the electronic device mounting board 1. After the electronic device 10 is mounted on the electronic device mounting board 1, the lid 12 may be bonded to the electronic device mounting board 1 with a lid bond 14.

The electronic package 21 is obtained by fabricating the electronic device mounting board 1 and mounting the electronic device 10 on the electronic device mounting board 1 through the processes (1) to (7). The processes (1) to (7) may be performed in any order.

Second Embodiment

Figure 10A:
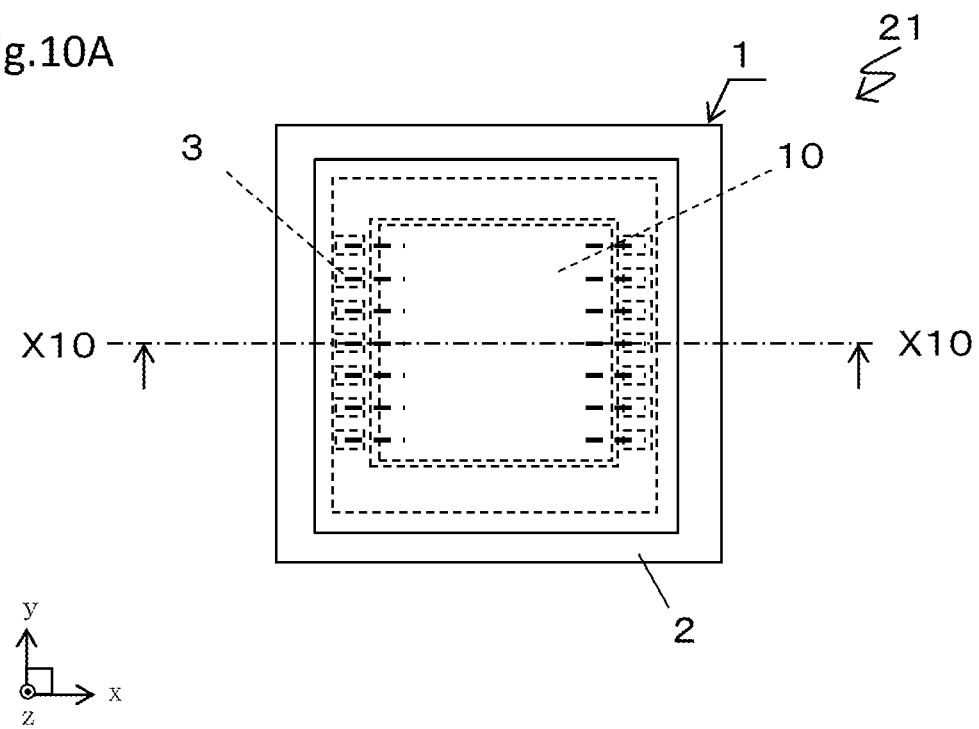
FIG. 10A is an external top view of an electronic device mounting board and an electronic package according to a second embodiment of the present invention.
Figure 10B:
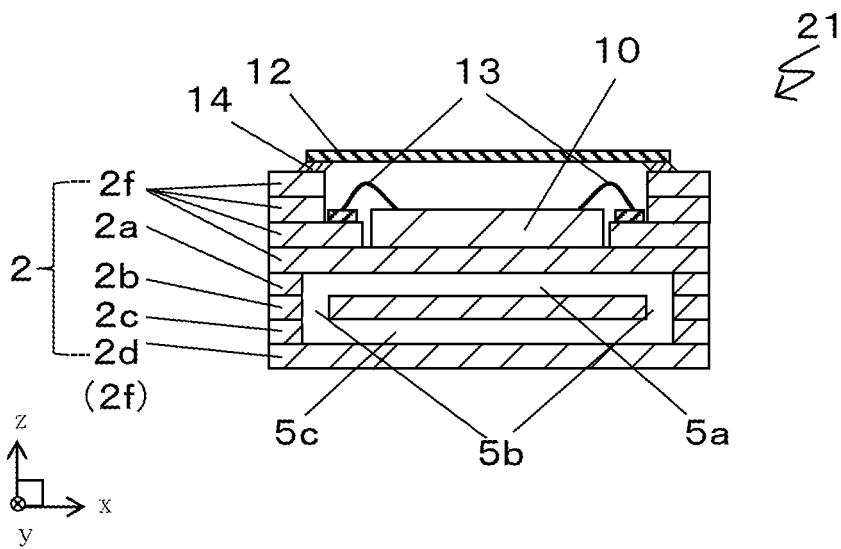
FIG. 10B is a cross-sectional view taken along line X10-X10 in FIG. 10A.
Figure 11A:
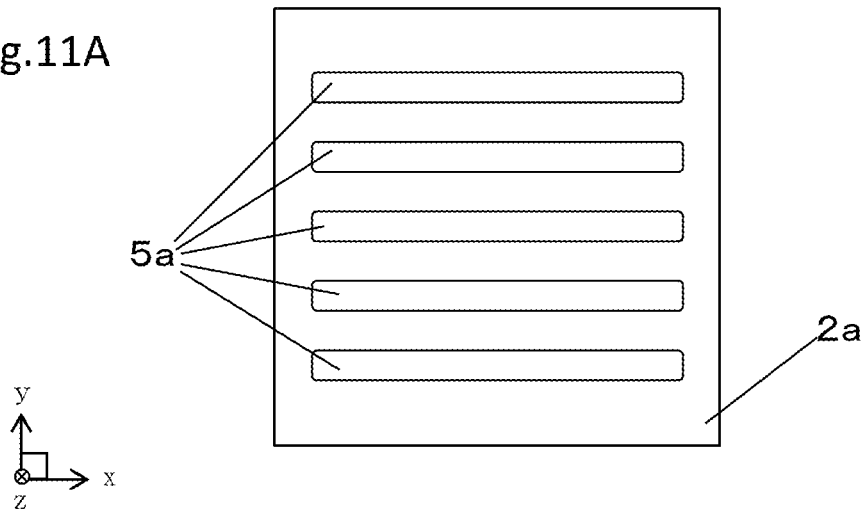
FIG. 11A is a plan view of an example first layer in the electronic device mounting board according to the second embodiment of the present invention.
Figure 11B:
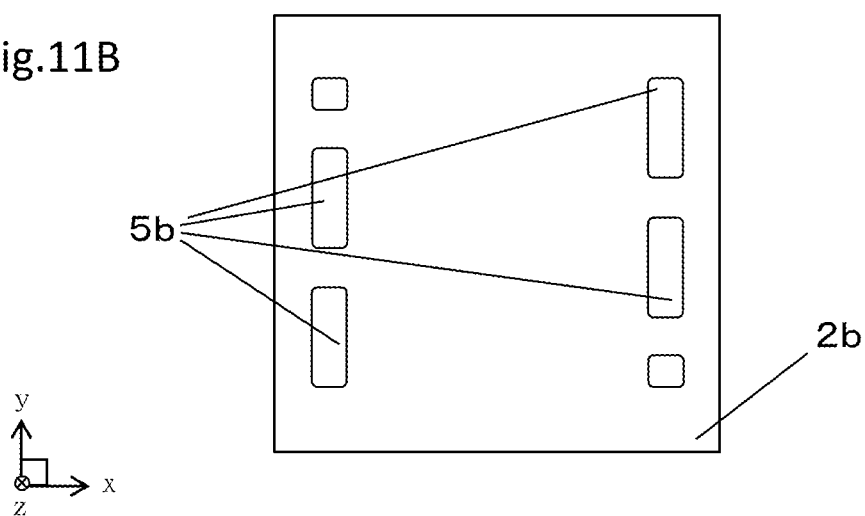
FIG. 11B is a plan view of an example second layer as an internal layer in the electronic device mounting board according to the second embodiment.
Figure 11C:
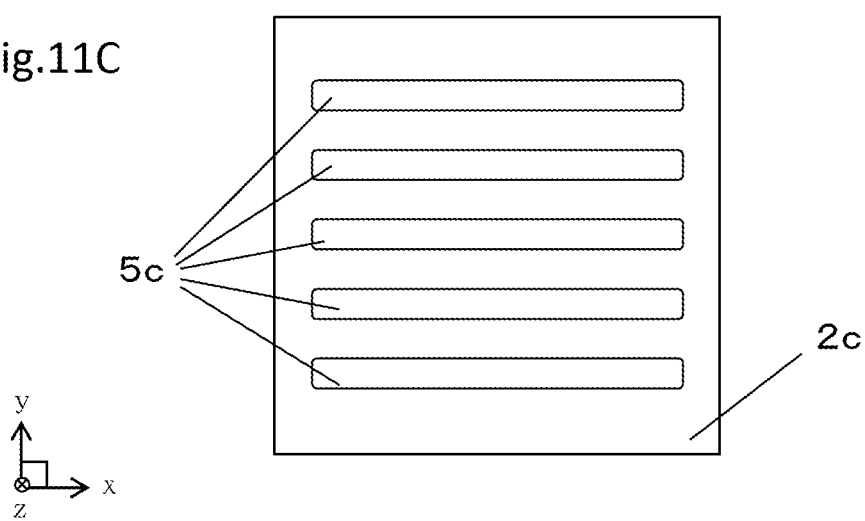
FIG. 11C is a plan view of an example third layer as an internal layer in the electronic device mounting board according to the second embodiment.

An electronic device mounting board 1 according to a second embodiment of the present invention will now be described with reference to FIGS. 10A to 11C. FIGS. 10A and 10B show the electronic device mounting board 1 and an electronic package 21 according to the present embodiment. FIGS. 11A to 11C show internal layers of the electronic device mounting board 1. Although FIGS. 11A to 11C simply show the first through-cavities 5a, the second through-cavities 5b, and third through-cavities 5c, without showing other components including inner wiring conductors and feedthrough conductors, such components may be included in actual products.

The electronic device mounting board 1 according to the present embodiment differs from the electronic device mounting board 1 according to the first embodiment in including the third through-cavities 5c in the third layer 2c.

In the example shown in FIGS. 10A and 10B, the substrate 2 in the electronic device mounting board 1 further includes the third layer 2c located on a lower surface of the second layer 2b. The third layer 2c has the third through-cavities 5c that are continuous with the second through-cavities 5b located in the upper surface. This structure allows the three-dimensional flow channel having the first through-cavities 5a, the second through-cavities 5b, and the third through-cavities 5c inside the substrate 2 to have a larger volume. In other words, this structure allows the flow channel to be wider in the thickness direction of the substrate 2 and further to have a larger volume in the planar direction in the third through-cavities 5c located in the third layer 2c. A smaller electronic device mounting board 1 can thus achieve and improve heat dissipation.

A flow channel herein refers to an area defined by a fourth layer 2d and/or the additional layer 2f located on the upper or lower ends of the first through-cavities 5a, the second through-cavities 5b, and the third through-cavities 5c. In other words, the flow channel is a space surrounded by the first layer 2a, the second layer 2b, the third layer 2c, the fourth layer 2d, and/or the additional layer 2f. The flow channel refers to a hollow space defined by the first through-cavities 5a, the second through-cavities 5b, and the third through-cavities 5c in the substrate 2.

FIGS. 11A to 11C show internal layers (2a, 2b, and 2c) of the electronic device mounting board 1.

FIGS. 11A to 11C show the internal layers corresponding to those included in the electronic device mounting board 1 shown in FIGS. 10A and 10B. As in the example shown in FIGS. 11A to 11C, the third through-cavities 5c, in a plan view, may overlap the first through-cavities 5a or may be located with a pitch different from the pitch of the first through-cavities 5a. The third through-cavities 5c may have be in a shape, size, or number different from the shape, size, or number of the first through-cavities 5a in a plan view.

The multiple third through-cavities 5c may be located parallel to one another. The structure including the third through-cavities 5c located parallel to one another increases the density of the third through-cavities 5c in portions in which heat dissipation is to be provided, thus further improving heat dissipation. With the third through-cavities 5c located parallel to one another, a liquid or fluid externally circulated to the substrate 2 through the channel 6 is less likely to be blocked at corners or other portions of the cavities. This achieves heat dissipation. Similarly to the first through-cavities 5a, the third through-cavities 5c may be located obliquely with respect to the periphery of the substrate 2.

The second through-cavities 5b are located to connect the first through-cavities 5a and the third through-cavities 5c. The first through-cavities 5a and the third through-cavities 5c may have their end portions or other portions connected to one another.

The first through-cavities 5a, the second through-cavities 5b, and the third through-cavities 5c may be sequentially continuous with one another into a single space. In other words, the first through-cavities 5a, the second through-cavities 5b, and the third through-cavities 5c are continuously connected together. A liquid or gas to be externally circulated to the substrate 2 through the channel 6 can flow from the inlet to the outlet through the channel 6. The liquid or gas is less likely to be retained and block the flow for heat dissipation. This achieves heat dissipation. Additionally, this structure allows heat to move in one direction and thus reduces the likelihood that retained heat causes uneven heat dissipation when a liquid or gas is not externally circulated to the substrate 2.

The third through-cavity 5c may have a curved end portion in a plan view. This structure reduces portions in which the second through-cavities 5b and the third through-cavities 5c do not overlap each other in a plan view when the second layer 2b and the third layer 2c are misaligned during manufacture of the substrate 2. The structure having the curved end portion reduces portions in which the second through-cavities 5b and the third through-cavities 5c do not overlap each other in a plan view when misalignment occurs in any direction. In the structure, the first through-cavities 5a and the second through-cavities 5b can be more reliably continuous with one another sequentially, thus producing the advantageous effects and achieving heat dissipation.

The second through-cavities 5b and/or the third through-cavities 5c have their end portions outward from the periphery of the outermost third through-cavity 5c and/or the second through-cavity 5b in a plan view. The second through-cavities 5b and/or the third through-cavities 5c have their end portions inward from or at the overlapping position with the periphery of the outermost third through-cavity 5c and/or the second through-cavity 5b in a plan view. This structure produces the same advantageous effects as produced based on the relationship between the first through-cavities 5a and the second through-cavities 5b described in the first embodiment.

The third through-cavities 5c are formed basically with the same procedure as the first through-cavities 5a described in the first embodiment. When, for example, the third layer 2c is formed from an electrical insulating ceramic material, the third through-cavities 5c can be formed with the same procedure as the first through-cavities 5a or the second through-cavities 5b by forming through-holes in a ceramic green sheet to be the third layer using a die or laser, or by punching.

Third Embodiment

An electronic device mounting board 1 according to a third embodiment of the present invention will now be described with reference to FIGS. 12A and 12B.

The electronic device mounting board 1 according to the present embodiment differs from the electronic device mounting board 1 according to the first embodiment in that an inorganic substrate 4 is located on the lower surface of the second layer 2b or the third layer 2c.

Figure 12A:
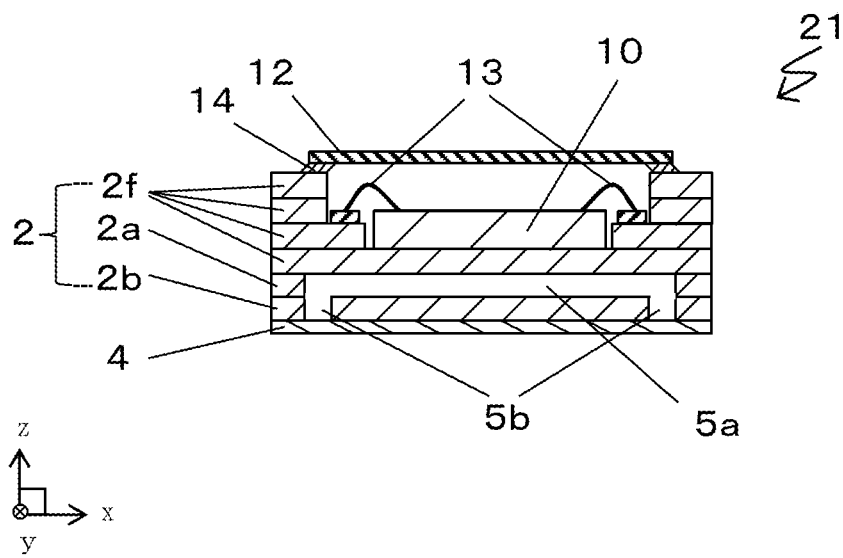
FIG. 12A is an external cross-sectional view of an electronic device mounting board and an electronic package according to a third embodiment of the present invention.

In the example shown in FIG. 12A, the inorganic substrate 4 is further provided on the lower surface of the second layer 2b. In other words, the second through-cavities 5b are exposed to (have the bottom at) the inorganic substrate 4. When, for example, the inorganic substrate 4 contains a metal material, the inorganic substrate 4 may have higher thermal conductivity than the substrate 2. The structure includes the second through-cavities 5b in the flow channel exposed to the inorganic substrate 4, while producing the advantageous effects of the embodiments of the present invention and further improving heat dissipation.

Figure 12B:
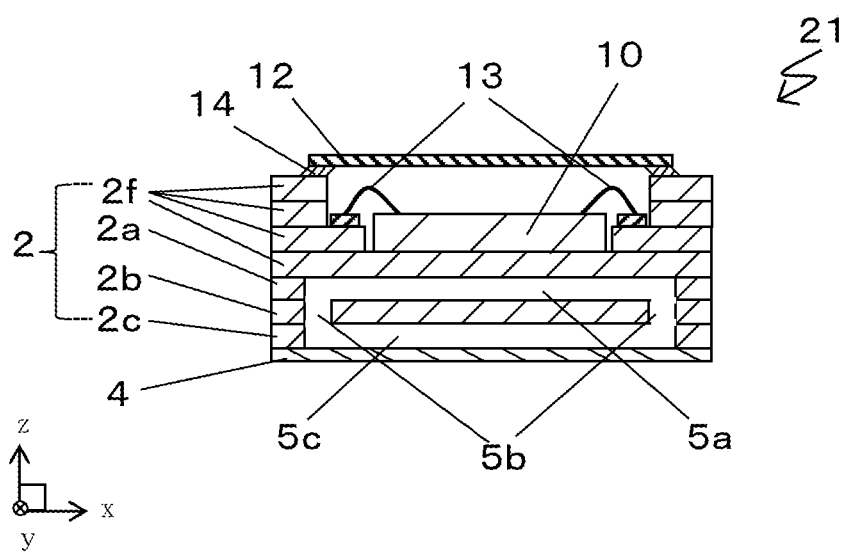
FIG. 12B is an external cross-sectional view of an electronic device mounting board and an electronic package according to a modification of the third embodiment of the present invention.

In the example shown in FIG. 12B, the inorganic substrate 4 is further provided on the lower surface of the third layer 2c. In other words, the third through-cavities 5c are exposed to (have the bottom at) the inorganic substrate 4. This structure increases the area of exposure to the inorganic substrate 4 (bottom area) as compared with the structure including the second through-cavities 5b exposed to the inorganic substrate 4 shown in FIG. 12A. This structure including the inorganic substrate 4 that achieves heat dissipation produces the advantageous effects of the embodiments of the present invention and further improves heat dissipation of the electronic device mounting board 1.

A flow channel herein refers to an area defined by the inorganic substrate 4 and/or the additional layer 2f located on the upper or lower ends of the first through-cavities 5a and the second through-cavities 5b (and the third through-cavities 5c). In other words, the flow channel is a space surrounded by the first layer 2a, the second layer 2b, the third layer 2c, the inorganic substrate 4, and/or the additional layer 2f. The flow channel refers to a hollow space defined by the first through-cavities 5a and the second through-cavities 5b (and the third through-cavities 5c) in the substrate 2.

In either example shown in FIG. 12A or FIG. 12B, a liquid or gas may be externally circulated to the substrate 2 for heat dissipation through the channel 6 including the first through-cavities 5a, the second through-cavities 5b, and the third through-cavities 5c. The liquid or gas for heat dissipation circulated in this manner can come in contact with the inorganic substrate 4 and further improve heat dissipation.

The inorganic substrate 4 may be formed from, for example, a material having high thermal conductivity. The material having high thermal conductivity facilitates dissipation, across the entire inorganic substrate 4, of heat generated during use of the electronic device 10 or heat applied for bonding the substrate 2 and the inorganic substrate 4 together with a bond. The use of this material can evenly cure the bond. This structure facilitates dissipation of heat generated in the electronic package 21 outside through the flow channel (the first through-cavities 5a, the second through-cavities 5b, and the third through-cavities 5c) included in the substrate 2. Examples of the material of the inorganic substrate 4 include sintered aluminum nitride, sintered silicon nitride, and silicon (Si). For the inorganic substrate 4 formed from, for example, sintered aluminum nitride or sintered silicon nitride, the inorganic substrate 4 may be a laminate of multiple insulating layers. The inorganic substrate 4 may be formed by covering the surface of the laminate of insulating layers with a conductive layer.

The inorganic substrate 4 may be formed from a metal material. Examples of the metal material include stainless steel (SUS), an Fe—Ni—Co alloy, alloy 42, copper (Cu), and a copper alloy. When, for example, the substrate 2 is formed from sintered aluminum oxide with a coefficient of thermal expansion of about $5 \times 10^{-6}/°$ C. to $10 \times 10^{-6}/°$ C., the inorganic substrate 4 may be formed from stainless steel (SUS 410 or SUS 304) with a coefficient of thermal expansion of about $10 \times 10^{-6}/°$ C. to $17 \times 10^{-6}/°$ C. In this case, the substrate 2 has a small difference in thermal contraction and expansion from the inorganic substrate 4. This reduces deformation of the inorganic substrate 4. The inorganic substrate 4 formed from a metal material has higher thermal conductivity and further improves heat dissipation.

The inorganic substrate 4 has a side length of, for example, about 0.3 mm to 10 cm, in correspondence with the size of the substrate 2. The inorganic substrate 4 has a thickness of, for example, at least 0.05 mm.

When the inorganic substrate 4 is formed from a metal material or the inorganic substrate 4 has the electrode pads or other components on the surface, the surface may be plated with nickel and gold. The plating layers effectively protect the surface of the inorganic substrate 4 against oxidative corrosion.

The substrate 2 and the inorganic substrate 4 may be bonded together with a bond.

Examples of the bond include a thermosetting resin and a brazing material. Examples of a thermosetting resin used as the material of the bond include a bisphenol A liquid epoxy resin. Examples of a brazing material used as the material of the bond include solder, lead, and glass. A material with high thermal conductivity may be selected as the bond.

The bond may be conductive. Examples of the conductive bond include silver epoxy, solder, an anisotropic conductive film (ACF), and an anisotropic conductive resin (an anisotropic conductive paste or ACP). The conductive bond may electrically connect the substrate 2 to the inorganic substrate 4. For example, the substrate 2 is electrically connected to the inorganic substrate 4 with the same potential as a ground electrode. This allows the inorganic substrate 4 to function as a shield for protecting the electronic device 10 from external noise.

The electronic device mounting board 1 shown in FIGS. 12A and 12B may be manufactured by, for example, bonding the inorganic substrate 4 to the substrate 2 manufactured with the method described in the first embodiment or the second embodiment.

The inorganic substrate 4 formed from a metal material is formed by, for example, punching a metal plate using a known stamping mold or etching a metal plate. The inorganic substrate 4 formed from a different material may be formed similarly by, for example, punching suitable for the material. The inorganic substrate 4 formed from, for example, an electrical insulating ceramic material can be manufactured with, for example, the processes (1) to (6) described in the first embodiment. The conditions such as the firing temperature or printing method are appropriately changed depending on the types of electrical insulating ceramic material used for the inorganic substrate 4. The substrate 2 and the inorganic substrate 4 are bonded together with the bond. The bond, which is a thermosetting resin (adhesive) paste, is applied to the bonding surface(s) of either or both the substrate 2 and the inorganic substrate 4 by screen printing or dispensing.

After the thermosetting resin is dried, the substrate 2 and the inorganic substrate 4 remaining stacked are then passed through a furnace, such as an oven or an atmosphere furnace having a tunnel structure, to pressurize and heat the stack. The substrate 2 and the inorganic substrate 4 are firmly bonded with the thermoset bond to form the electronic device mounting board 1.

Fourth Embodiment

An electronic device mounting board 1 according to a fourth embodiment of the present invention will now be described with reference to FIGS. 13A to 14B.

The electronic device mounting board 1 according to the present embodiment differs from the electronic device mounting board 1 according to the first embodiment in that the first through-cavities 5a have end portions overlapping the end portion of the substrate 2 and a channel 6 is provided.

Figure 13A:
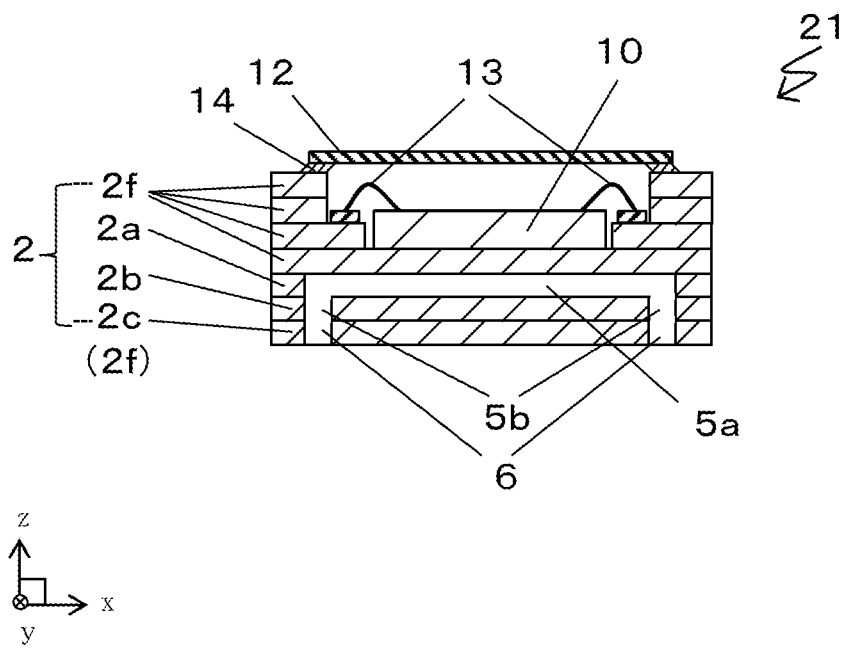
FIG. 13A is an external cross-sectional view of an electronic device mounting board and an electronic package according to a fourth embodiment of the present invention.
Figure 14A:
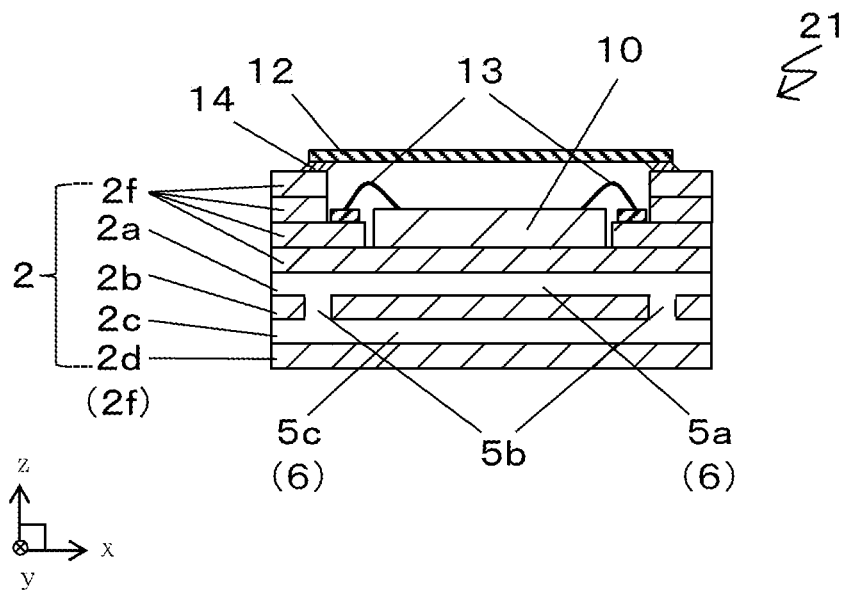
FIG. 14A is an external cross-sectional view of an electronic device mounting board and an electronic package according to another modification of the fourth embodiment of the present invention.
Figure 14B:
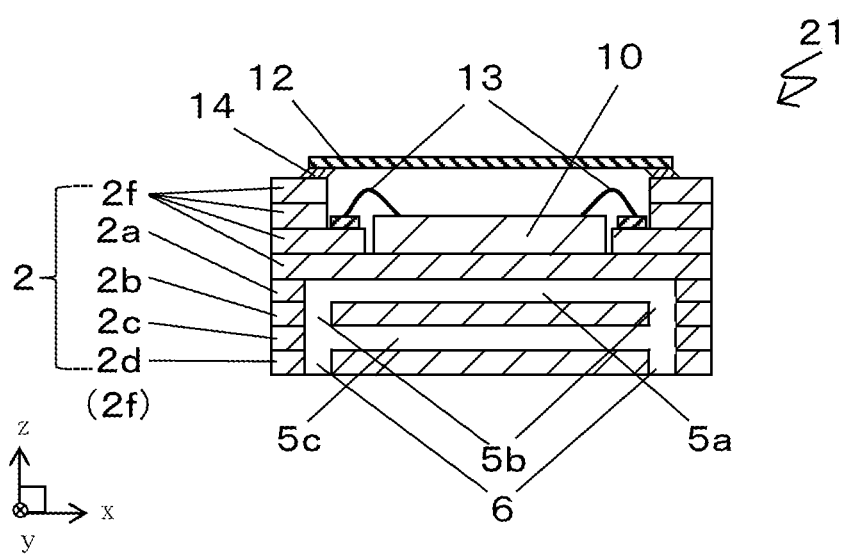
FIG. 14B is an external cross-sectional view of an electronic device mounting board and an electronic package according to still another modification of the fourth embodiment of the present invention.

In the examples shown in FIGS. 13A and 14B, the channel 6 extends from the lower surface of the substrate 2 and reaches the flow channel including the first through-cavities 5a and the second through-cavities 5 (and the third through-cavities 5c). When the third through-cavities 5c are provided, the channel 6 extends from the lower surface of the substrate 2 and reaches the flow channel including the first through-cavities 5a, the second through-cavities 5, and the third through-cavities 5c. In other words, the third layer 2c includes the channel 6 continuous with the second through-cavities 5*b* in FIG. 13A, and the fourth layer 2*d* includes the channel 6 continuous with the third through-cavities 5*c* in FIG. 14B. This allows a liquid or gas to be externally circulated to and fill the substrate 2 for heat dissipation. This thus improves heat dissipation. A liquid or gas having high thermal conductivity may fill the substrate 2 for heat dissipation and close the channel 6, thus improving heat dissipation. In this structure as well, the first through-cavities 5*a* and the second through-cavities 5*b* are continuous with one another in the substrate 2. Thus, the first through-cavities 5*a* and the second through-cavities 5*b* define a three-dimensional flow channel inside the substrate 2. This structure allows the flow channel to be wider in the thickness direction of the substrate 2 and thus to have a larger volume. A smaller electronic device mounting board 1 can thus achieve and improve heat dissipation.

In the example shown in FIG. 14A, the first through-cavities 5*a* have end portions overlapping the end portion of the substrate 2. In the example shown in FIG. 14A, the third through-cavities 5*c* may have end portions overlapping the end portion of the substrate 2. The first through-cavities 5*a* and/or the third through-cavities 5*c* with the end portions overlapping the end portion of the substrate 2 can partly serve the same function as the channel 6. The channels are thus filled with a liquid or gas to be externally circulated to the substrate 2 for heat dissipation, thus improving heat dissipation. A liquid or gas having high thermal conductivity may fill the substrate 2 for heat dissipation and close the first through-cavities 5*a* and/or the third through-cavities 5*c*, thus improving heat dissipation. In this structure as well, the first through-cavities 5*a* and the second through-cavities 5*b* (and the third through-cavities 5*c*) are continuous with one another in the substrate 2. Thus, the first through-cavities 5*a* and the second through-cavities 5*b* define a three-dimensional flow channel inside the substrate 2. This structure allows the flow channel to be wider in the thickness direction of the substrate 2 and thus to have a larger volume. A smaller electronic device mounting board 1 can thus achieve and improve heat dissipation.

In the example shown in FIG. 12B, the second through-cavities 5*b* have end portions overlapping the end portion of the substrate 2. The second through-cavities 5*b* with the end portions overlapping the end portion of the substrate 2 can partly serve the same function as the channel 6, similarly to the example shown in FIG. 14A. This structure produces the same advantageous effects as the structure shown in FIG. 14A.

A flow channel herein refers to an area defined by the third layer 2*c*, the fourth layer 2*d*, and/or the additional layer 2*f* located on the upper or lower ends of the first through-cavities 5*a* and the second through-cavities 5*b* (and the third through-cavities 5*c*). In other words, the flow channel is a space surrounded by the first layer 2*a*, the second layer 2*b*, the third layer 2*c*, the fourth layer 2*d*, and/or the additional layer 2*f*. The flow channel refers to a hollow space defined by the first through-cavities 5*a* and the second through-cavities 5*b* (and the third through-cavities 5*c*) in the substrate 2.

The channel 6 in the example of FIG. 13A or 14B is formed basically with the same procedure as the first through-cavities 5*a* or other through-cavities described in the first embodiment. When, for example, the third layer 2*c* or the fourth layer 2*d* is formed from an electrical insulating ceramic material, the channel 6 can be formed with the same procedure as the first through-cavities 5*a* or the second through-cavities 5*b* by forming through-holes in a ceramic green sheet to be the third layer 2*c* or the fourth layer 2*d* using a die or laser, or by punching.

Figure 13B:
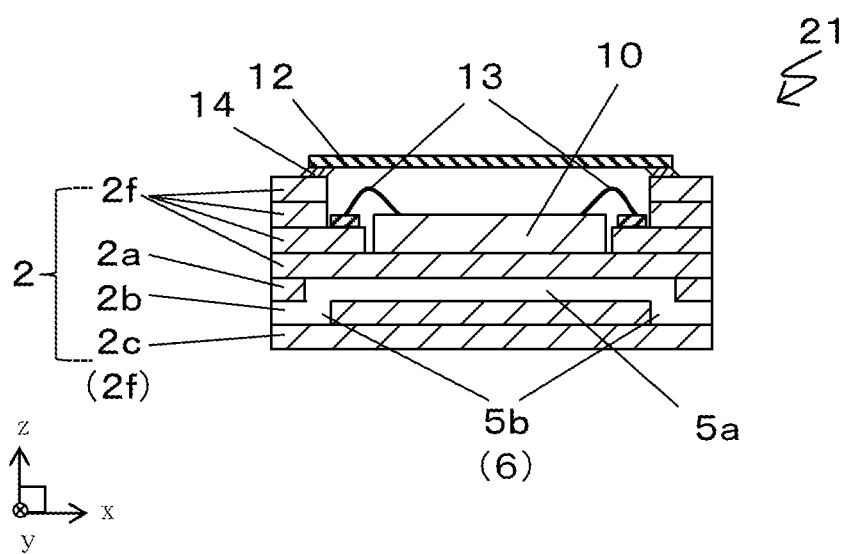
FIG. 13B is an external cross-sectional view of an electronic device mounting board and an electronic package according to a modification of the fourth embodiment of the present invention.

The first through-cavities 5*a* and/or the third through-cavities 5*c* shown in FIGS. 13B and 14A are formed basically with the same procedure as in the first embodiment by forming through-holes with different sizes using a die or laser, or by punching.

The present invention is not limited to the examples described in the above embodiments. All the features including numerical values in the embodiments may be combined unless any contradiction arises. For example, although the first through-cavities 5*a* to the third through-cavities 5*c* are quadrangular in a plan view in the examples shown in FIGS. 1A to 14B, they may be circular, elliptical, or may be in other shapes. The first through-cavities 5*a* to the third through-cavities 5*c* may have the same size or different sizes. For example, although the electrode pads 3 are quadrangular in a plan view in the examples shown in FIGS. 1A to 14B, they may be circular or may be other polygons. In the embodiments, any number of electrode pads 3 with any shapes may be in any arrangement, and the electronic device may be mounted with any method.

REFERENCE SIGNS LIST 1 electronic device mounting board
2 substrate
2*a* first layer
2*b* second layer
2*c* third layer
2*d* fourth layer
2*f* additional layer
3 electrode pad
4 inorganic substrate
5 through-hole
5*a* first through-cavity
5*b* second through-cavity
5*c* third through-cavity
5*f* additional through-hole
6 channel
10 electronic device
12 lid
13 electronic device bond
14 lid bond
21 electronic package
31 electronic module
32 housing

The invention claimed is:

1. An electronic device mounting board, comprising:
a substrate on which an electronic device is mountable, the substrate including a first layer and a second layer located on a lower surface of the first layer;
a plurality of first through-cavities located through the first layer in a thickness direction of the first layer; and
at least one second through-cavity located through the second layer in a thickness direction of the second layer, the at least one second through-cavity overlapping the plurality of first through-cavities in a plan view,
wherein each of the plurality of first through-cavities is continuous with the at least one second through-cavity, and
wherein in at least one place where the first through-cavity and the second through-cavity overlap each other, the first through-cavity has an end portion located outward from a periphery of an outermost one of a plurality of the second through-cavity, and the second through-cavity has an end portion located outward from a periphery of an outermost one of the plurality of first through-cavities in a plan view, such that a first end portion of the first through-cavity and a second end portion of the first through cavity are located outward from the periphery of the outermost one of a plurality of the second through-cavity.

2. The electronic device mounting board according to claim 1, wherein
the plurality of first through-cavities are located parallel to one another.

3. The electronic device mounting board according to claim 1, wherein
the plurality of first through-cavities and the at least one second through-cavity are quadrangular in a plan view, and
the plurality of first through-cavities each have a longer side that is longer than a longer side of the at least one second through-cavity.

4. The electronic device mounting board according to claim 1, wherein
an outermost portion of the plurality of first through-cavities in a plan view is located outward from an end portion of the at least one second through-cavity in a plan view.

5. The electronic device mounting board according to claim 1, wherein
at least one of the plurality of first through-cavities include a curved end portion in a plan view.

6. The electronic device mounting board according to claim 1, wherein
the at least one second through-cavity includes a curved end portion in a plan view.

7. The electronic device mounting board according to claim 1, wherein
at least one of the plurality of first through-cavities includes an end portion overlapping an end portion of the substrate.

8. The electronic device mounting board according to claim 1, further comprising:
a third layer located on a lower surface of the second layer.

9. The electronic device mounting board according to claim 8, further comprising:
a bottom plate with higher thermal conductivity than the substrate located on a lower surface of the third layer.

10. The electronic device mounting board according to claim 1, further comprising:
a bottom plate with higher thermal conductivity than the substrate located on a lower surface of the second layer.

11. The electronic device mounting board according to claim 1, wherein
the plurality of first through-cavities comprise at least three first through-cavities, and
the at least one second through-cavity connects end portions of all the first through-cavities.

12. The electronic device mounting board according to claim 1, wherein
the at least one second through-cavity overlaps end portions of adjacent ones of the plurality of first through-cavities.

13. The electronic device mounting board according to claim 1, wherein
the plurality of first through-cavities and the at least one second through-cavity are sequentially continuous with one another into a single space.

14. An electronic package, comprising:
the electronic device mounting board according to claim 1; and
an electronic device mounted on the electronic device mounting board.

15. An electronic module, comprising:
the electronic package according to claim 14; and
a housing located above the electronic package.

16. The electronic device mounting board according to claim 1, wherein a channel through which a heat-dissipating substance flows in or flows out is located on a lower surface or a side surface of a substrate.

17. An electronic device mounting board, comprising:
a substrate on which an electronic device is mountable, the substrate including a first layer and a second layer located on a lower surface of the first layer;
a plurality of first through-cavities located through the first layer in a thickness direction of the first layer; and
at least one second through-cavity located through the second layer in a thickness direction of the second layer, the at least one second through-cavity overlapping the plurality of first through-cavities in a plan view,
wherein each of the plurality of first through-cavities is continuous with the at least one second through-cavity,
wherein in at least one place where the first through-cavity and the second through-cavity overlap each other, the first through-cavity has an end portion located outward from a periphery of an outermost one of a plurality of the second through-cavity, and the second through-cavity has an end portion located outward from a periphery of an outermost one of the plurality of first through-cavities in a plan view, and
wherein at least one of an end portion of a first through-cavity and an end portion of a second through-cavity has a circular shape having a diameter that is greater than a width in a direction perpendicular to a longitudinal direction of a corresponding through-cavity.

18. An electronic device mounting board, comprising:
a substrate on which an electronic device is mountable, the substrate including a first layer and a second layer located on a lower surface of the first layer;
a plurality of first through-cavities located through the first layer in a thickness direction of the first layer; and
at least one second through-cavity located through the second layer in a thickness direction of the second layer, the at least one second through-cavity overlapping the plurality of first through-cavities in a plan view,
wherein each of the plurality of first through-cavities is continuous with the at least one second through-cavity,
wherein in at least one place where the first through-cavity and the second through-cavity overlap each other, the first through-cavity has an end portion located outward from a periphery of an outermost one of a plurality of the second through-cavity, and the second through-cavity has an end portion located outward from a periphery of an outermost one of the plurality of first through-cavities in a plan view, and
wherein the plurality of first through-cavities and the plurality of second through-cavities are connected together into a single space.

* * * * *